United States Patent
Hwang et al.

(10) Patent No.: US 6,730,561 B2
(45) Date of Patent: May 4, 2004

(54) METHOD OF FORMING A CUP CAPACITOR

(75) Inventors: Jeng H. Hwang, Cupertino, CA (US); Guangxiang Jin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 83 days.

(21) Appl. No.: 09/876,282

(22) Filed: Jun. 6, 2001

(65) Prior Publication Data

US 2003/0013252 A1 Jan. 16, 2003

(51) Int. Cl.$^7$ .................. H01L 21/8242; H01L 21/20
(52) U.S. Cl. .................................. 438/253; 438/396
(58) Field of Search ......................... 438/250–256, 438/393–399

(56) References Cited

U.S. PATENT DOCUMENTS

| | | | |
|---|---|---|---|
| 5,354,705 A | 10/1994 | Mathews et al. | 437/52 |
| 5,627,094 A | 5/1997 | Chan et al. | 438/253 |
| 5,963,814 A | 10/1999 | Walker et al. | 438/387 |
| 6,057,239 A * | 5/2000 | Wang et al. | 438/689 |
| 6,090,663 A | 7/2000 | Wu | 438/253 |
| 6,162,681 A * | 12/2000 | Wu | 438/253 |
| 6,325,676 B1 * | 12/2001 | Jung et al. | 439/719 |
| 6,350,642 B1 * | 2/2002 | Lee et al. | 438/238 |
| 2002/0043681 A1 * | 4/2002 | Tsu et al. | 257/301 |
| 2003/0054605 A1 * | 3/2003 | Kim et al. | 438/240 |

FOREIGN PATENT DOCUMENTS

| | | | |
|---|---|---|---|
| WO | WO 00/31789 | 6/2000 | H01L/21/311 |

* cited by examiner

*Primary Examiner*—John F. Niebling
*Assistant Examiner*—Jennifer M. Kennedy
(74) *Attorney, Agent, or Firm*—Shirley Church; Joseph Bach; Kathi Bean

(57) ABSTRACT

A simple method of forming a cup capacitor is disclosed. The method typically involves only "dry" deposition and etching steps, allowing applicants' method to be performed in a single processing apparatus, if so desired. The method includes the following steps: a) providing a semiconductor structure including a dielectric layer overlying a semiconductor substrate, wherein a cup is present in the dielectric layer, the cup having an opening at an upper surface of the dielectric layer; b) depositing a conformal layer of a conductive material over the dielectric layer, including the sidewalls and bottom of the cup; c) depositing a layer of a sacrificial material over the conductive material, in an amount sufficient to fill the cup; d) removing sacrificial material present on an upper surface (field surface) of the conductive layer outside of and adjacent to the cup by plasma etching, using a plasma source gas which selectively etches the sacrificial material relative to the conductive material; e) removing conductive material present on an upper surface (field surface) of the dielectric layer outside of and adjacent to the cup by plasma etching, using a plasma source gas which selectively etches the conductive material relative to the sacrificial material remaining inside of the cup; and f) removing sacrificial layer material remaining inside of the cup by etching, using an etchant which selectively etches the sacrificial material inside of the cup relative to the conductive material inside of the cup.

38 Claims, 14 Drawing Sheets

FIG. 4F-A

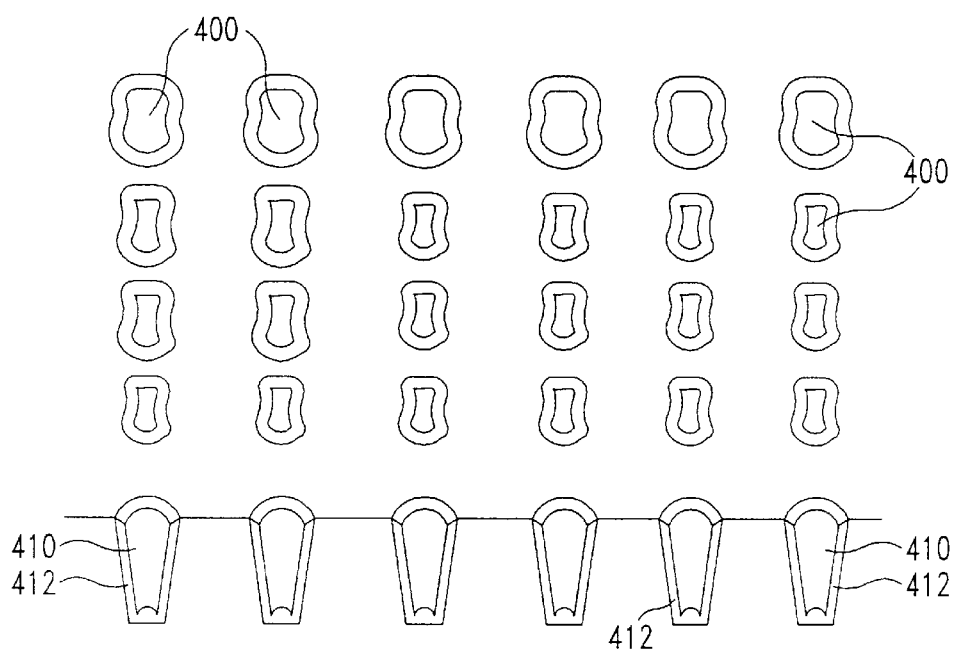
FIG. 4F-B
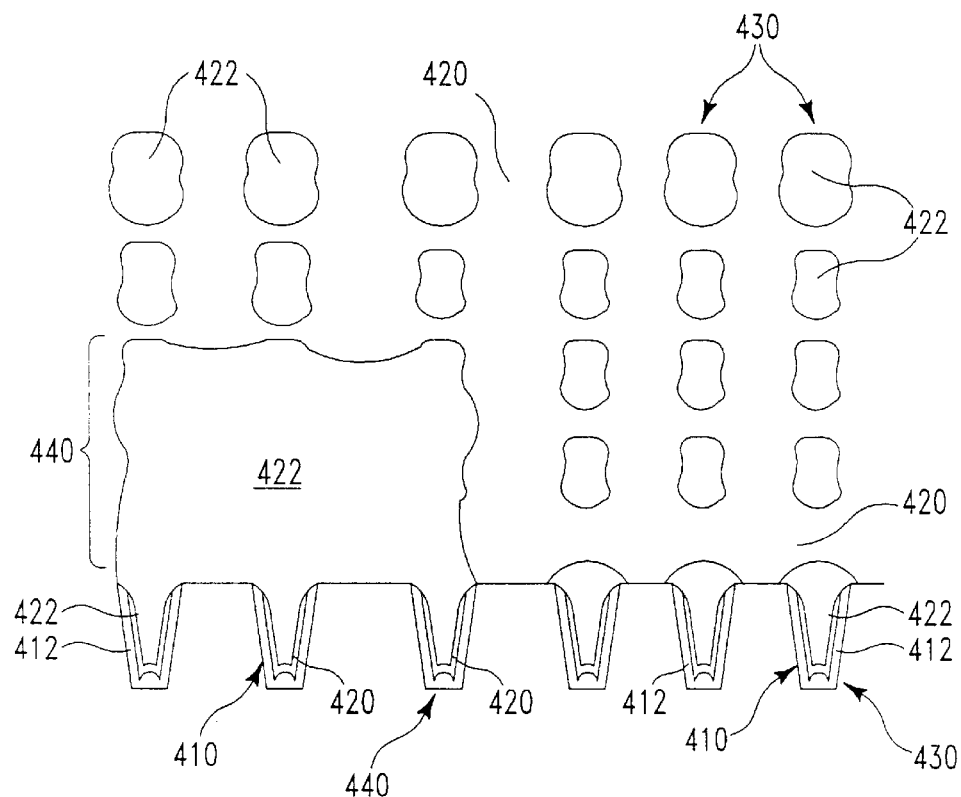
FIG. 4L-B

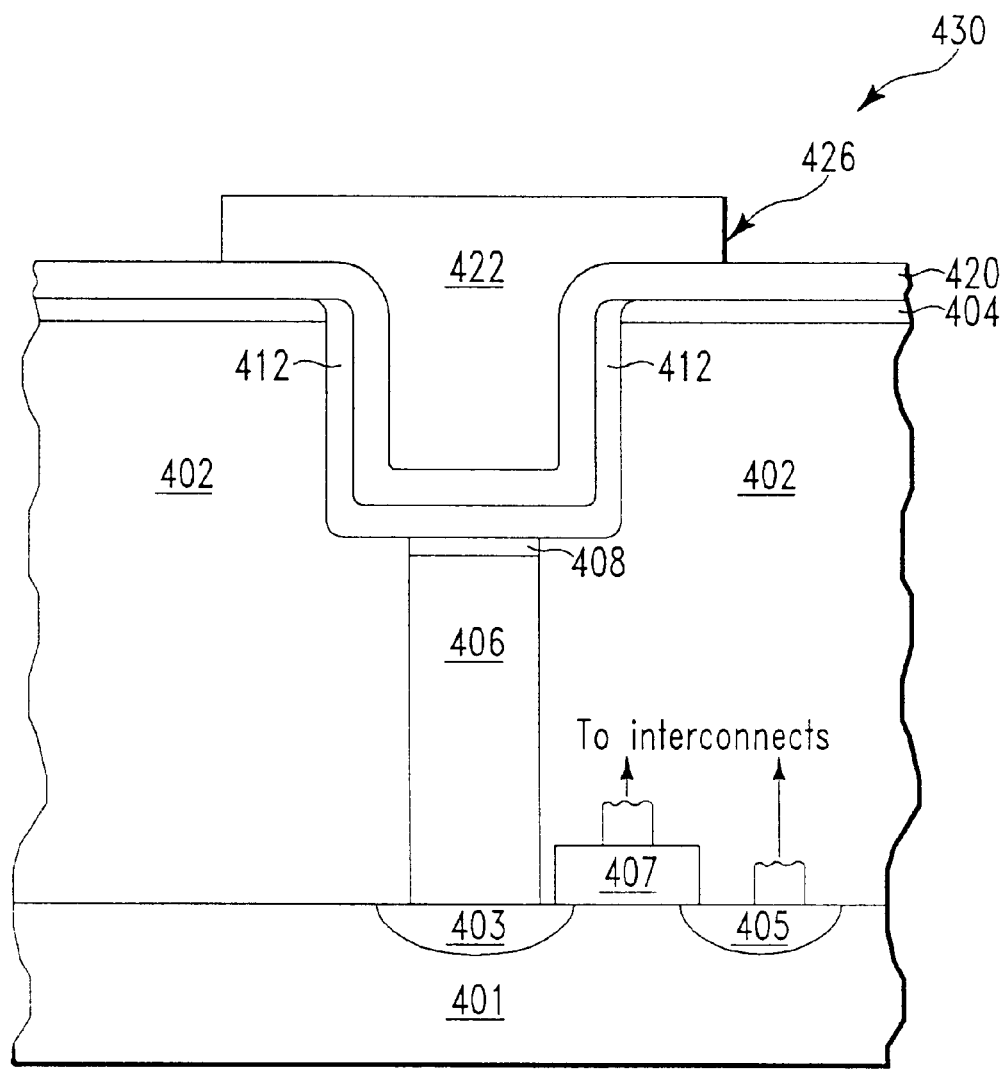
FIG. 4L-A

METHOD OF FORMING A CUP CAPACITOR

BACKGROUND OF THE INVENTION

1. Field of the Invention

The present invention pertains to a method of forming a capacitor, in particular, a cup capacitor.

2. Brief Description of the Background Art

The implementation of digital information storage and retrieval is a common application of modern digital electronics. Memory size and access time serve as a measure of progress in computer technology. Quite often, storage capacitors are employed as memory array elements. As the state of the art has advanced, high density dynamic random access memory (DRAM) devices require smaller storage capacitors of the same capacitance by, for example, employing high dielectric constant materials or ferroelectric materials. The high dielectric constant materials or ferroelectric materials frequently include sintered metal oxide and may contain a substantial amount of reactive oxygen. In the formation of capacitors employing ferroelectric materials or films, the electrodes must be composed of materials which are difficult to oxidize, to prevent oxidation of the electrodes, which would decrease the capacitance of storage capacitors. Therefore, metals such as platinum, iridium, and ruthenium are preferred metals for use in the manufacture of capacitors for high density DRAMs. These metals are likely to be the preferred electrode materials in future generation memory devices. Platinum has emerged as a particularly attractive candidate because it is inert to oxidation and is known to have a leakage current ($<10^{-9}$ amps/cm$^2$) which is lower than that of many other metals. Platinum is also a good conductor.

As the state of the art has advanced, various designs for capacitor structures have emerged. One type of design is the cup capacitor, which is also known as a container capacitor or inlaid capacitor. Various cup capacitor designs and manufacturing techniques are described in the art. One method for forming conductive container structures on a supporting substrate of a semiconductor device includes the following steps: forming an insulating layer over parallel conductive lines and existing material on the surface of the supporting substrate; providing openings into the insulating layer, the openings forming vertical sidewalls in the insulating layer that resides between two neighboring conductive lines and thereby exposing an underlying conductive material; forming a sacrificial layer that makes contact with the underlying conductive material; forming a barrier layer overlying and conforming to the sacrificial layer; forming insulating spacers on the vertical sidewalls of the barrier layer; removing portions of the barrier layer and the sacrificial layer that span between the insulating spacers to thereby expose a portion of the underlying conductive material; removing the insulating spacers and thereby exposing the barrier layer; forming a conductive layer that conforms to the exposed barrier layer, makes contact to the underlying conductive material and forms multiple containers; forming a filler material in the container; removing portions of the conductive layer, the barrier layer and the sacrificial layer down to an upper portion of the insulating layer, thereby forming individual container structures; removing the insulating layer, thereby exposing the sacrificial layer surrounding the outer surfaces of the container structures; and removing the sacrificial layer, the remaining barrier layer and the fill layer, thereby exposing the outer and inner surfaces of the container structures.

According to another method for forming a stacked container capacitor, a first dielectric layer, a second dielectric layer, and a patterned mask layer are formed successively upon a semiconductor substrate. An anisotropic etch process is then performed to etch an aperture at least partially through the first dielectric layer using an anisotropic etch process. The second dielectric layer is then selectively etched relative to the first dielectric layer using an isotropic etch process, forming a ledge above the first dielectric layer and below the patterned masking layer. After removal of the masking layer, a first polysilicon layer, a third dielectric layer, and a second polysilicon layer are formed in the etched aperture. The filled aperture is then planarized until a flange of the first polysilicon layer formed into the ledge is exposed.

In a method of forming a container capacitor having a recessed conductive layer, which is typically made of polysilicon, chemical mechanical planarization is used to remove the layer of polysilicon and an overlying layer of photoresist from an upper surface of a substrate in which a container is formed. A wet etch is performed to selectively isolate a rim of the polysilicon within the container to recess the rim, while the remainder of the polysilicon in the container is protected by a photoresist layer.

In another method for forming a high-density DRAM cell with a polysilicon, cup-shaped capacitor, a first dielectric layer is formed on a semiconductor substrate. A second dielectric layer is formed on the first dielectric layer, followed by the formation of a first conductive layer on the second dielectric layer. Portions of the first conductive layer and the second dielectric layer are then removed to define an opening. A second conductive layer is formed conformably on the substrate within the opening and on the first conductive layer. A sidewall structure is then formed within the opening on the sidewalls of the second conductive layer. Next, a portion of the second conductive layer which is not covered by the sidewall structure is removed. The sidewall structure and a portion of the first dielectric layer are removed, using the residual second conductive layer as a mask, to define a contact hole within the first dielectric layer. A third conductive layer is formed conformably on the substrate to fill up the contact hole. Portions of the first conductive layer and the third conductive layer are removed to define a storage node. The second dielectric layer is then removed and a third dielectric layer is formed on the substrate. Finally, a fourth conductive layer is formed on the third dielectric layer to complete the formation of the capacitor.

A more detailed description of the Background Art described above can be found in U.S. Pat. No. 5,354,705, issued Oct. 11, 1994, to Mathews et al.; U.S. Pat. No. 5,627,094, issued May 6, 1997, to Chan et al.; U.S. Pat. No. 5,963,814, issued Oct. 5, 1999, to Walker et al.; and U.S. Pat. No. 6,090,663, issued Jul. 18, 2000, to Wu.

One prior art process for forming a cup capacitor is illustrated in FIGS. 3A through 3G. Referring to FIG. 3A, a starting structure 300 for forming a cup capacitor includes, from bottom to top, a semiconductor substrate 301, a dielectric layer 302 overlying the semiconductor substrate 301, and a patterned layer 304 of photoresist overlying the dielectric layer 302. Source 303 and drain 305 regions have been previously formed in semiconductor substrate 301 by ion implantation. Source 303 and drain 305 regions are connected by gate region 307. A polysilicon plug 306 and diffusion barrier layer 308 have been previously formed in dielectric layer 302, using conventional techniques known in the art. Polysilicon plug 306 contacts source region 303.

Drain region 305 and gate region 307 are further connected to various interconnects (not shown).

Referring to FIG. 3B, dielectric layer 302 is pattern etched, using patterned photoresist layer 304 as a mask and etching techniques known in the art, to form a cup 310 in dielectric layer 302. Prior to performing further processing steps, the remaining photoresist layer 304 is removed, as shown in FIG. 3C.

Referring to FIG. 3D, a conformal conductive material layer 312 is then deposited over the sidewalls and bottom of the cup 310, using deposition techniques known in the art to provide a substantially conformal deposition. A layer 314 of a sacrificial material (typically silicon oxide) is then deposited to fill the cup 310, as shown in FIG. 3E.

Portions of the sacrificial material 314 overlying field surface 315 and cup 310 are then removed using a chemical-mechanical polishing (CMP) process (not shown). Conductive material 312 present on field surface 315 is also removed. However, CMP techniques have detrimental effects on the semiconductor structure, including substrate dishing, scratching, poor polishing uniformity across the substrate, and particulate residue, for example. As shown in FIG. 3F, the use of CMP planarization techniques can result in uneven surface topography 316 and loss of conductive material 312 near the edge of the cup 310. Following CMP planarization of the sacrificial material 314 and conductive material 312, the remaining sacrificial material is typically removed in a wet etch step, such as by immersion of the substrate wafer in an HF solution, to form the final structure 320 shown in FIG. 3G. Subsequent processing steps can then be performed to form a cup capacitor.

In addition to the problems encountered with the use of CMP planarization, the process described above is unattractive from a process integration standpoint. For example, following the formation of the structure shown in FIG. 3E, the substrate wafer must be moved to a different processing apparatus for chemical-mechanical polishing to planarize the sacrificial material 314 and to remove conductive material 312 from surface 315 adjacent cup 310. Then the substrate wafer must be moved to an HF bath to remove the remaining sacrificial material 314 within the cup 310, prior to the performance of subsequent plasma processing steps in a different apparatus to form the cup capacitor.

It would therefore be desirable to provide a method for forming a cup capacitor that is simple from a process integration standpoint and does not require the use of CMP and/or wet etch techniques.

SUMMARY OF THE INVENTION

Applicants have discovered a simple method for forming a cup capacitor. Applicants' method typically involves only "dry" deposition and etching steps, and does not require the use of chemical-mechanical polishing. If desired, applicants' method can be performed in a multi-chambered, dry processing apparatus, which permits easy control of the ambient which contacts surfaces of the capacitor during fabrication.

Accordingly, disclosed herein is a method of forming a cup capacitor comprising the following steps:

a) providing a semiconductor structure including a dielectric layer overlying a semiconductor substrate, wherein a cup is present in the dielectric layer, the cup having an opening at an upper surface of the dielectric layer;

b) depositing a conformal layer of a conductive material over the dielectric layer, including the sidewalls and bottom of the cup;

c) depositing a layer of a sacrificial material over the conductive material, in an amount sufficient to fill the cup;

d) removing sacrificial material present on an upper surface (field surface) of the conductive layer outside of and adjacent to the cup by plasma etching, using a plasma source gas which selectively etches the sacrificial material relative to the conductive material;

e) removing conductive material present on an upper surface (field surface) of the dielectric layer outside of and adjacent to the cup by plasma etching, using a plasma source gas which selectively etches the conductive material relative to the sacrificial material remaining inside of the cup; and f) removing sacrificial layer material remaining inside of the cup by etching, using an etchant which selectively etches the sacrificial material inside of the cup relative to the conductive material inside of the cup.

BRIEF DESCRIPTION OF THE DRAWINGS

FIGS. 4A–4L illustrate an exemplary embodiment of the method of the invention for forming a cup capacitor.

DETAILED DESCRIPTION OF EXEMPLARY EMBODIMENTS

Disclosed herein is a method for forming a cup capacitor. Exemplary processing conditions for performing the method of the invention are set forth below.

As a preface to the detailed description, it should be noted that, as used in this specification and the appended claims, the singular forms "a", "an", and "the" include plural referents, unless the context clearly dictates otherwise.

I. An Apparatus for Practicing the Invention

The embodiment example etch processes described herein were carried out in a CENTURA® Integrated Processing System available from Applied Materials, Inc., of Santa Clara, Calif. The system is shown and described in U.S. Pat. No. 5,583,737 to Collins et al., the disclosure of which is hereby incorporated by reference.

Figure 1:
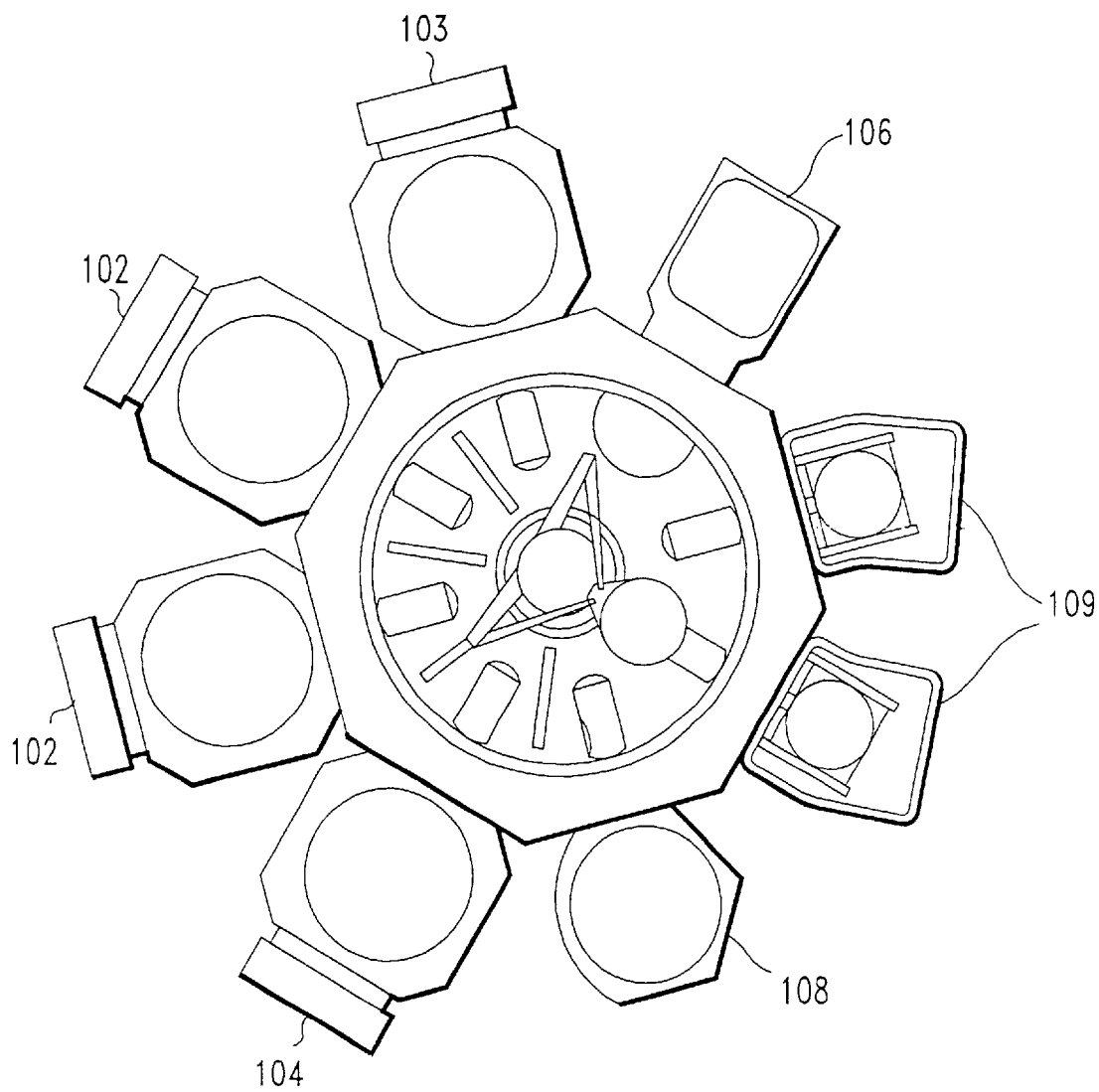
FIG. 1A shows a schematic of a multi-chambered semiconductor processing system of the kind which can be used to carry out the processes described herein.
FIG. 1B shows a schematic of a cross-sectional view of a plasma etch chamber of the kind which can be used to carry out the etching processes described herein.

FIG. 1A shows an elevation schematic of the CENTURA® Integrated Processing System. The CENTURA® Integrated Processing System is a fully automated semiconductor fabrication system, employing a single-wafer, multi-chamber, modular design which accommodates 200-mm or 300-mm wafers. For example, as shown in FIG. 1A, the CENTURA® etch system may include decoupled plasma source (DPS) etch chambers 102; deposition chamber 103; advanced strip-and-passivation (ASP) chamber 104; wafer orienter chamber 106; cooldown chamber 108; and independently operated loadlock chambers 109.

Figure 1B:
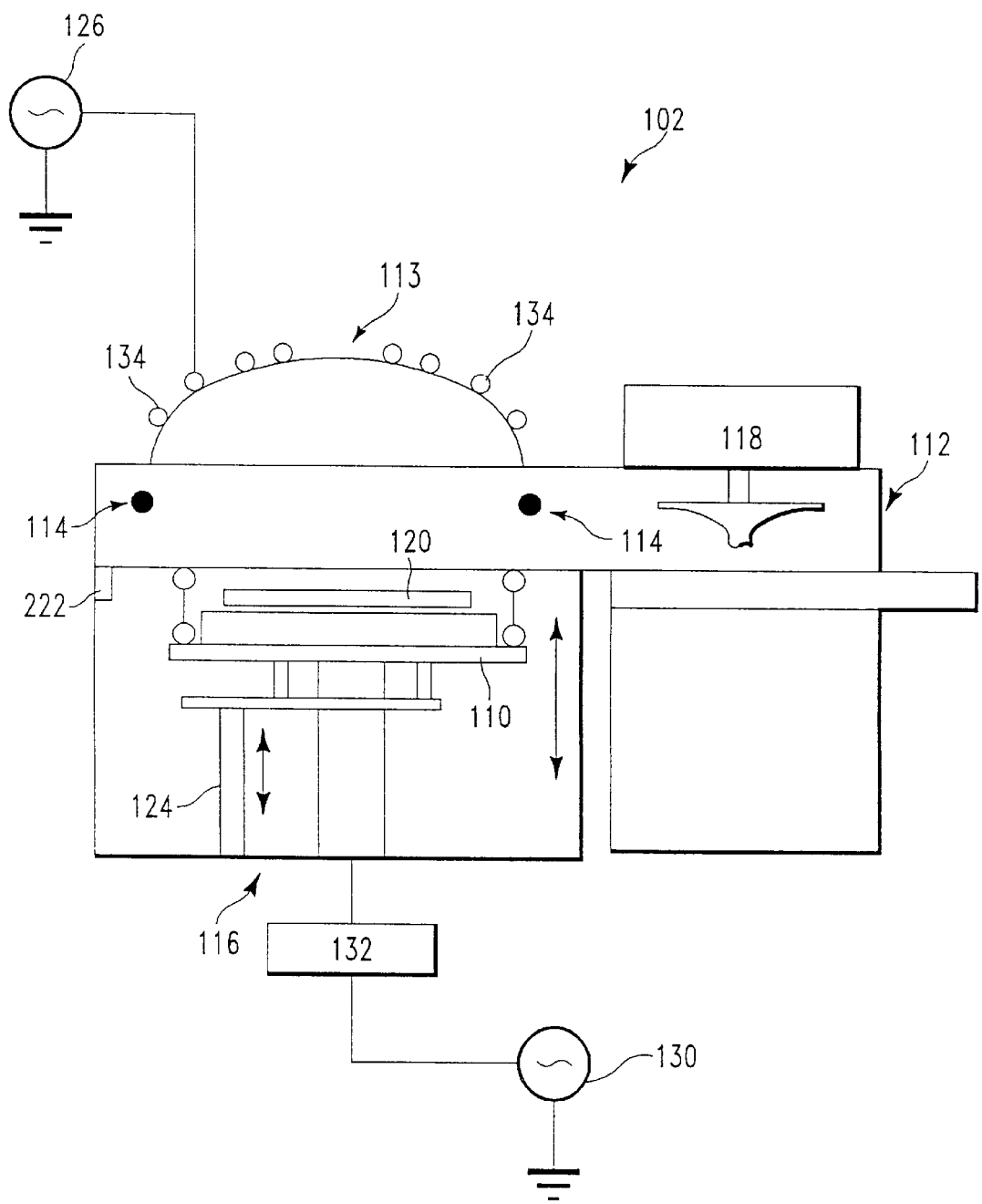

FIG. 1B is a schematic of an individual CENTURA® DPS™ etch chamber 102 of the type used in the Applied Materials CENTURA® Integrated Processing System. The equipment shown in schematic in FIG. 1B includes a Decoupled Plasma Source (DPS) of the kind described by Yan Ye et al. at the Proceedings of the Eleventh International Symposium of Plasma Processing, May 7, 1996, and as published in the Electrochemical Society Proceedings, Volume 96-12, pp. 222–233 (1996). The CENTURA® DPS™ etch chamber 100 is configured to be mounted on a standard CENTURA® mainframe.

The CENTURA® DPS™ etch chamber 102 consists of an upper chamber 112 having a ceramic dome 113, and a lower chamber 116. The lower chamber 116 includes an electrostatic chuck (ESC) cathode 110. Gas is introduced into the chamber via gas injection nozzles 114 for uniform gas distribution. Chamber pressure is controlled by a closed-loop pressure control system (not shown) with a throttle valve 118. During processing, a substrate 120 is introduced into the lower chamber 116 through inlet 122. The substrate 120 is held in place by means of a static charge generated on the surface of electrostatic chuck (ESC) cathode 110 by applying a DC voltage to a conductive layer located under a dielectric film on the chuck surface. The cathode 110 and substrate 120 are then raised by means of a wafer lift 124 and a seal is created against the upper chamber 112 in position for processing. Etch gases are introduced into the upper chamber 112 via the ceramic gas injection nozzles 114. The etch chamber 102 uses an inductively coupled plasma source power 126 operating at 2 MHz, which is connected to inductive coil 134 for generating and sustaining a high density plasma. The wafer is biased with an RF source 130 and matching network 132 operating at 13.56 MHz. Power to the plasma source 126 and substrate biasing means 130 are controlled by separate controllers (not shown).

The temperature on the surface of the etch chamber walls is controlled using liquid-containing conduits (not shown) which are located in the walls of the etch chamber 102. The temperature of the semiconductor substrate is controlled by stabilizing the temperature of the electrostatic chuck cathode 110 upon which the substrate 120 rests. Typically, a helium gas flow is used to facilitate heat transfer between the substrate and the pedestal.

When the end point of an etch is signaled by the etch reaching an interface with a different material, an endpoint subsystem (not shown) senses the end of the etch process by monitoring changes in the light emitted by the plasma in the etch chamber 102. Data is then displayed on a PC monitor. The operator sets an algorithm which controls the endpoint subsystem using optical emission spectroscopy (OES).

Although the etch process chamber used to process the substrates described in the Examples presented herein is shown in schematic in FIG. 1B, any of the etch processors available in the industry should be able to take advantage of the etch chemistry described herein, with some adjustment to other process parameters.

Figure 2:
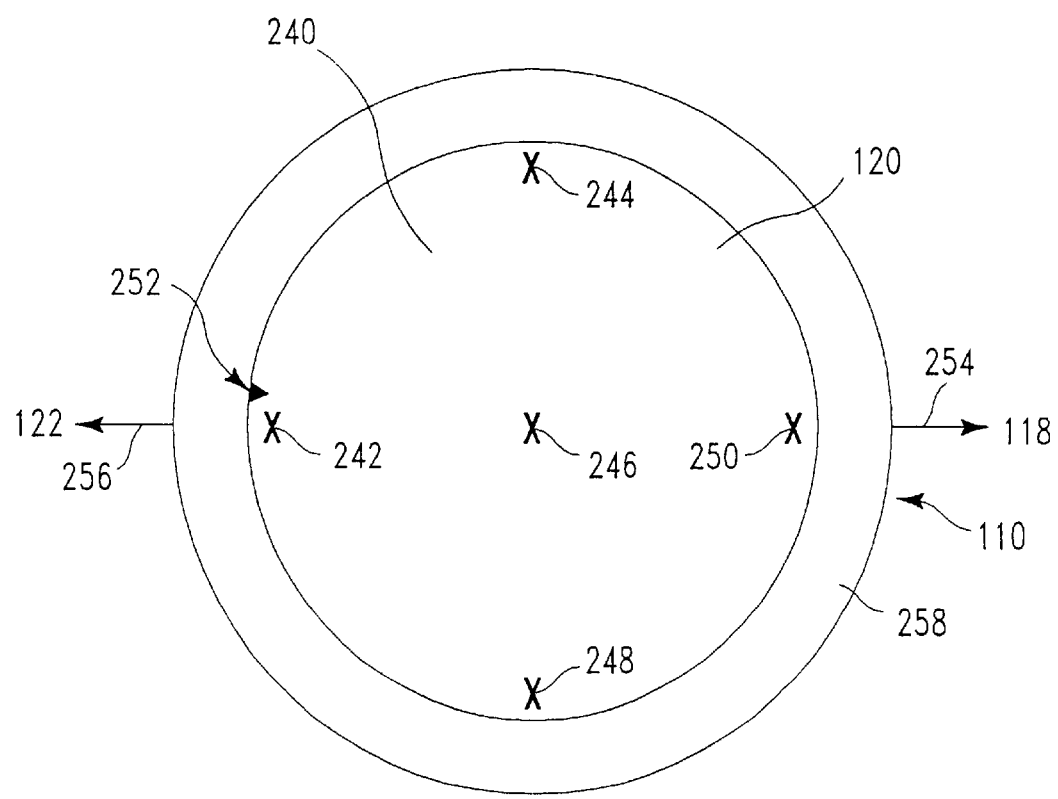
FIG. 2 shows a schematic of a substrate surface, indicating the bottom, left, center, right, and top locations of a substrate as it is positioned within the plasma etch chamber shown in schematic cross-section in FIG. 1B.
Figure 3A:
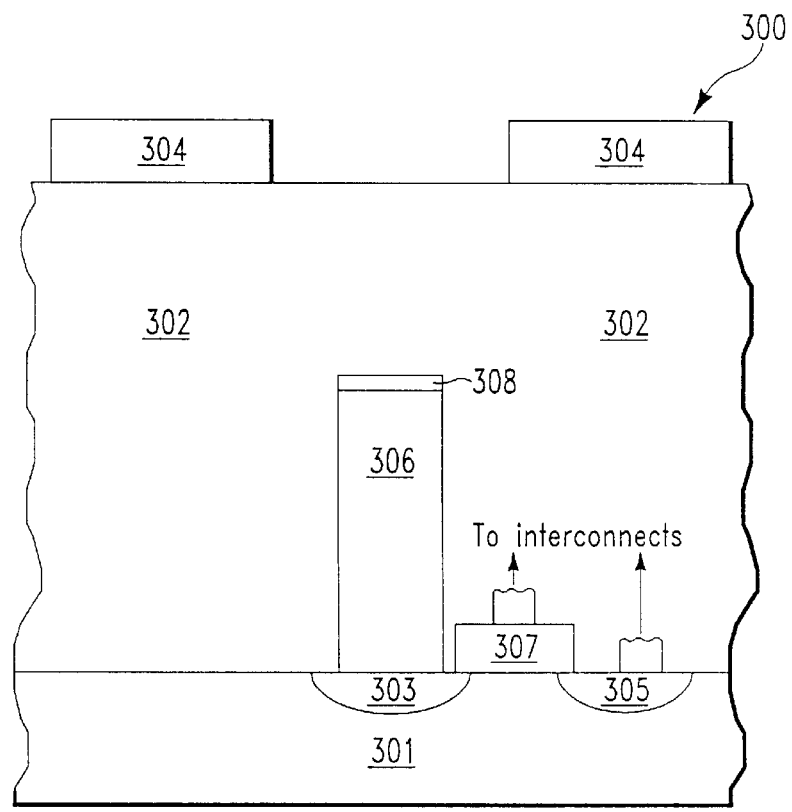
FIGS. 3A–3G illustrate a prior art method of forming a cup capacitor.
Figure 3B:
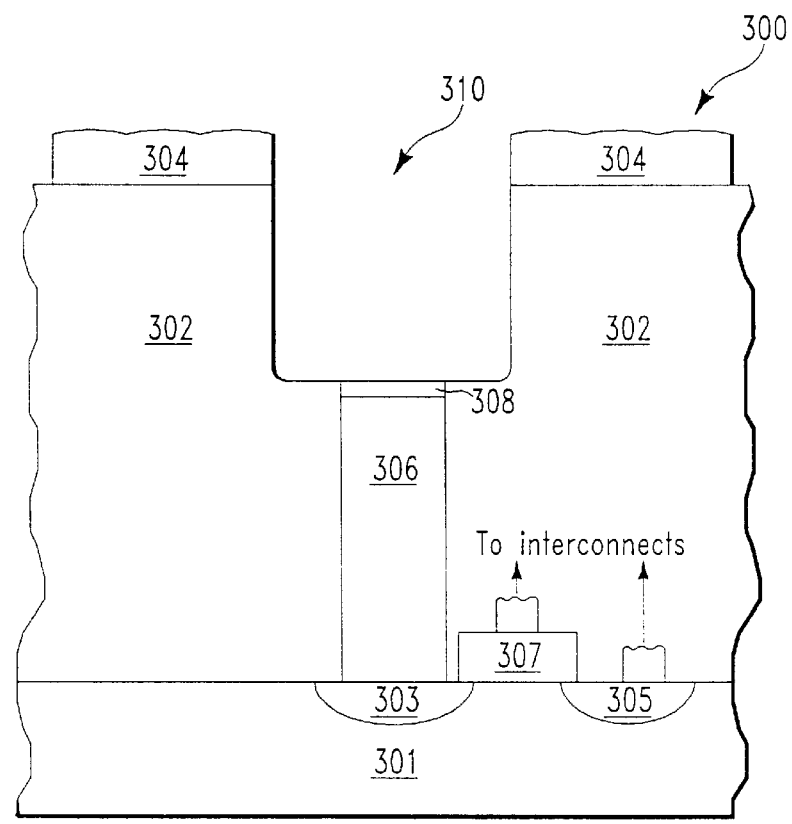
Figure 3C:
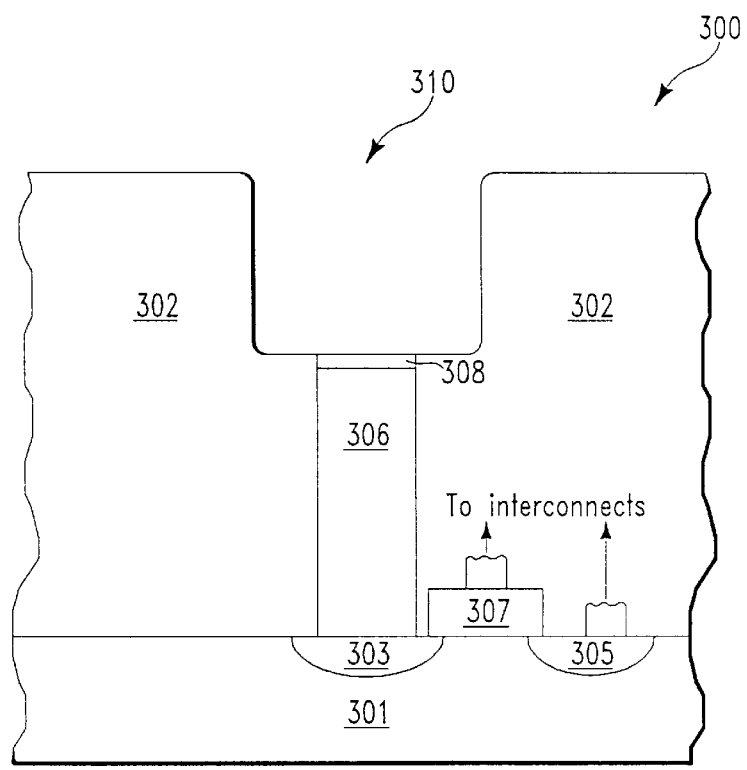
Figure 3D:
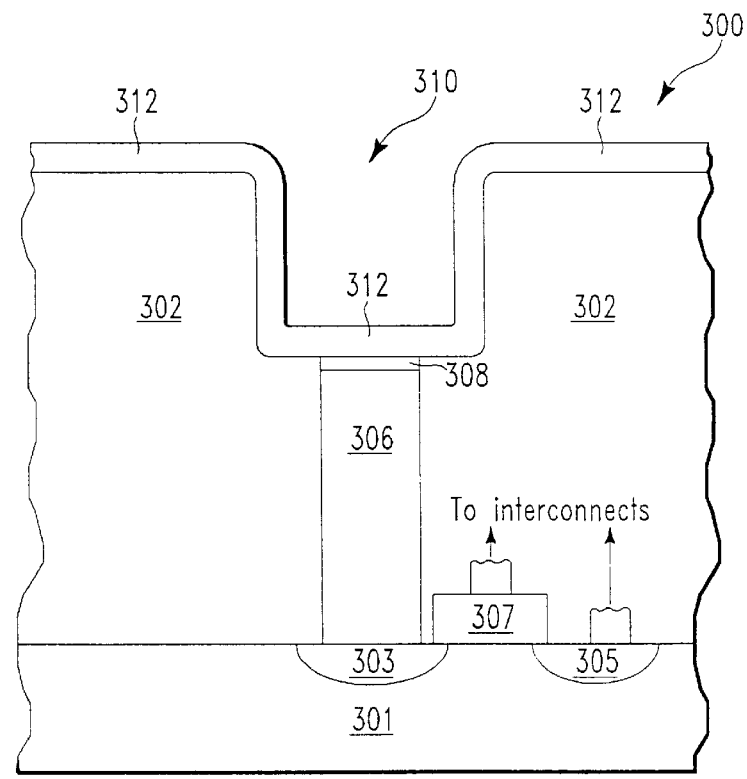
Figure 3E:
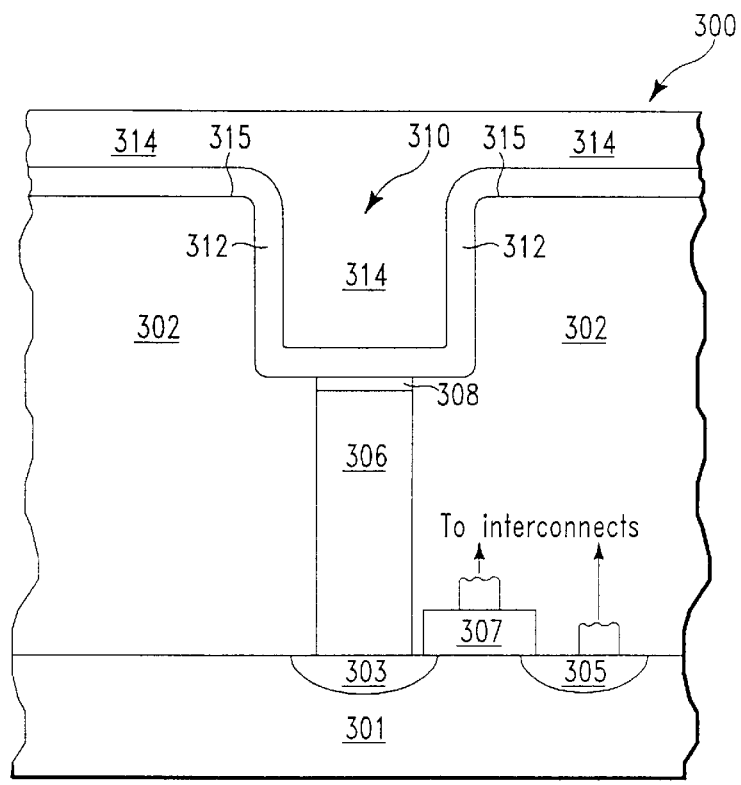
Figure 3F:
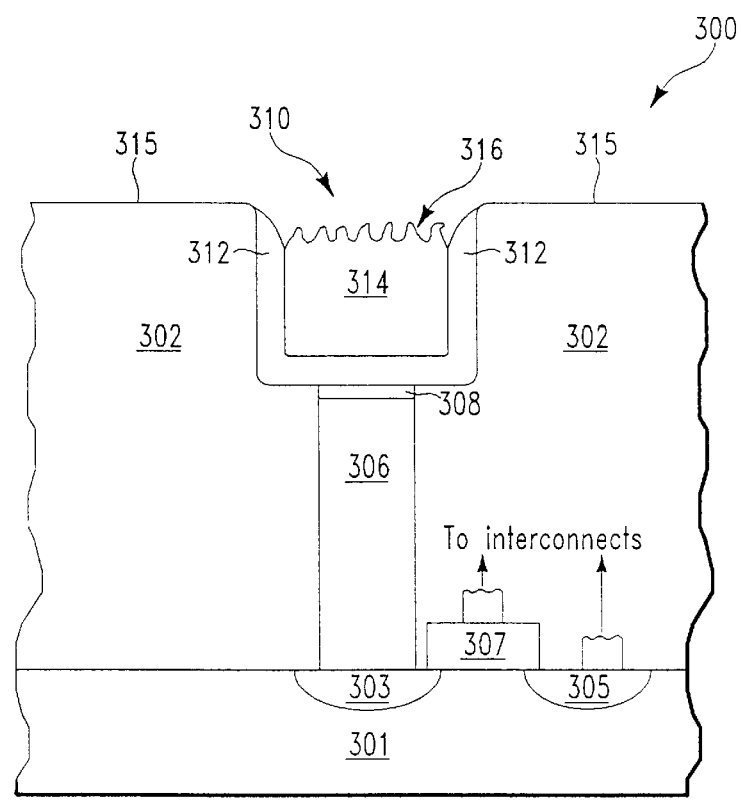
Figure 3G:
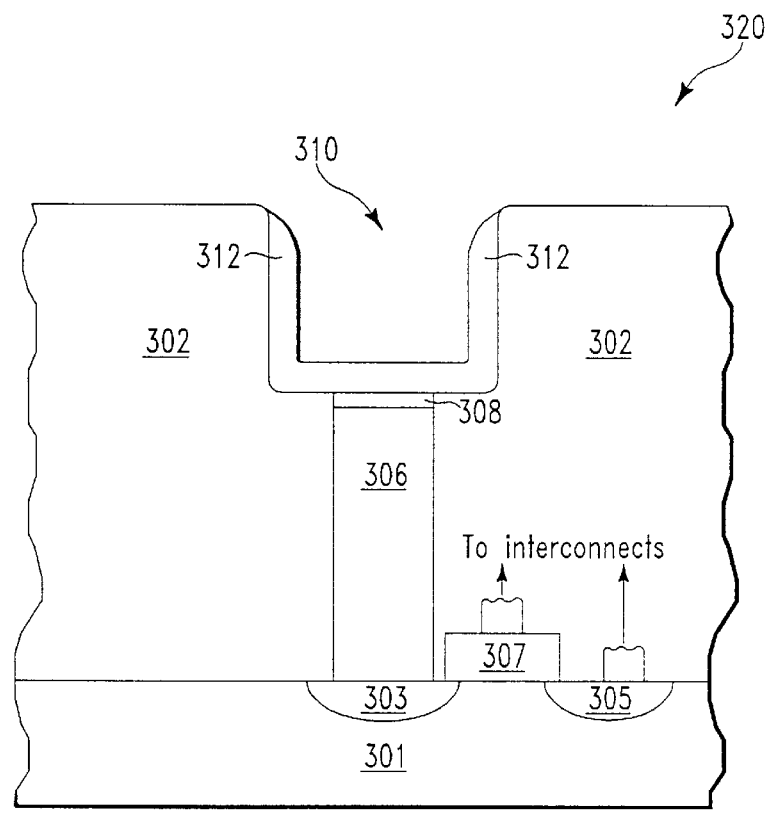

FIG. 2 shows a schematic of a substrate 120 surface 240, including the bottom 242, left 244, center 246, right 248, and top 250 surface locations on substrate 120 (a silicon wafer in this case), relative to a notch 252 located at the bottom 242 of the substrate 120. These surface locations are shown, relative to the schematic of the DPS™ etch chamber 102 shown in FIG. 1B, where arrow 254 indicates the direction toward vacuum throttle valve 118, arrow 256 indicates the direction toward inlet 122, and substrate 120 is shown resting on upper surface 258 of electrostatic chuck 110.

II. Exemplary Method of the Invention for Forming a Cup Capacitor

The exemplary method of the invention is a combination of steps within a series of steps used to fabricate a cup capacitor. A typical starting structure upon which the combination of steps is performed is described below.

Figure 4A:
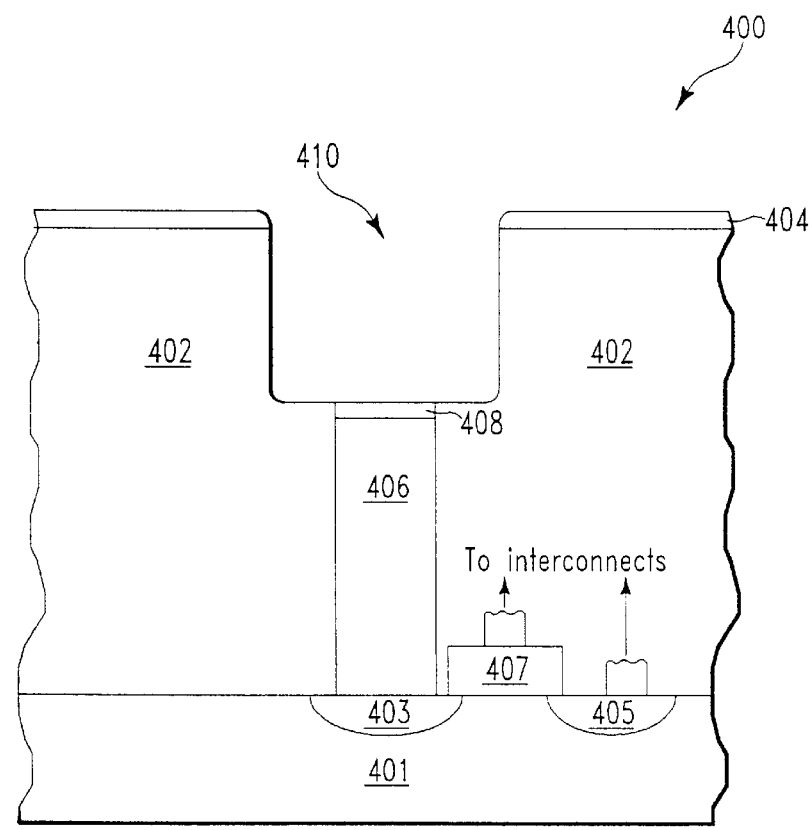

FIG. 4A shows a semiconductor structure 400 which represents a starting structure of the kind upon which the method of the present invention is performed. The semiconductor structure 400 includes, from bottom to top, a semiconductor substrate 401, a dielectric layer 402 overlying the semiconductor substrate 401, and an optional, patterned etch stop layer 404 overlying the dielectric layer 402. Dielectric layer 402 has previously been pattern etched, forming a cup 410.

The structure 400 shown in FIG. 4A can be formed using conventional deposition and etch techniques known in the art. The relative thicknesses of the various layers in semiconductor structure 400 are not shown to scale.

The substrate 401 is typically single-crystal silicon, but may alternatively be another semiconductor material, such as silicon-on-insulator (SOI) or epitaxial silicon, for example. Source 403 and drain 405 regions may be formed in silicon substrate 401 by ion implantation, and are connected by gate region 407; together they function as a switching device, like a transistor.

Overlying substrate 401 is dielectric layer 402. The dielectric layer 402 typically comprises silicon oxide, but may alternatively comprise silicon nitride or silicon oxynitride. The dielectric layer 402 typically has a thickness within the range of about 5000 Å to about 10,000 Å. A polysilicon plug 406 and diffusion barrier layer 408 have been previously formed in dielectric layer 402, underlying the cup 410. Polysilicon plug 406 contacts source region 403. Drain region 405 and gate region 407 are further connected to various interconnects (not shown).

The purpose of diffusion barrier layer 408 is to prevent the diffusion of silicon molecules from the polysilicon plug 406 into the subsequently deposited conductive material layer 412 (shown in FIG. 4B). The diffusion barrier layer 408 is typically a refractory metal or a refractory metal nitride, such as titanium or titanium nitride. The optional diffusion barrier layer 408 typically has a thickness within the range of about 50 Å to about 500 Å.

Preferably, the structure 400 includes an etch stop layer 404 deposited over the dielectric layer 402 toward the upper edge of cup 410. In addition to providing a convenient etch endpoint during etch back of a subsequently applied conductive material layer 412 (shown in FIG. 4B), the etch stop layer 404 prevents etching into the dielectric layer 402 during removal of a subsequently applied sacrificial material layer 414 (shown in FIG. 4C).

Preferably, an etch stop layer material is selected which is not readily etched using the etchant gas compositions used to etch the conductive material or the sacrificial material, The etch stop layer is typically a dielectric material such as silicon nitride, silicon oxynitride, silicon carbide, or tantalum oxide, by way of example and not by way of limitation. The etch stop layer 404 typically has a thickness within the range of about 100 Å to about 1000 Å.

Figure 4B:
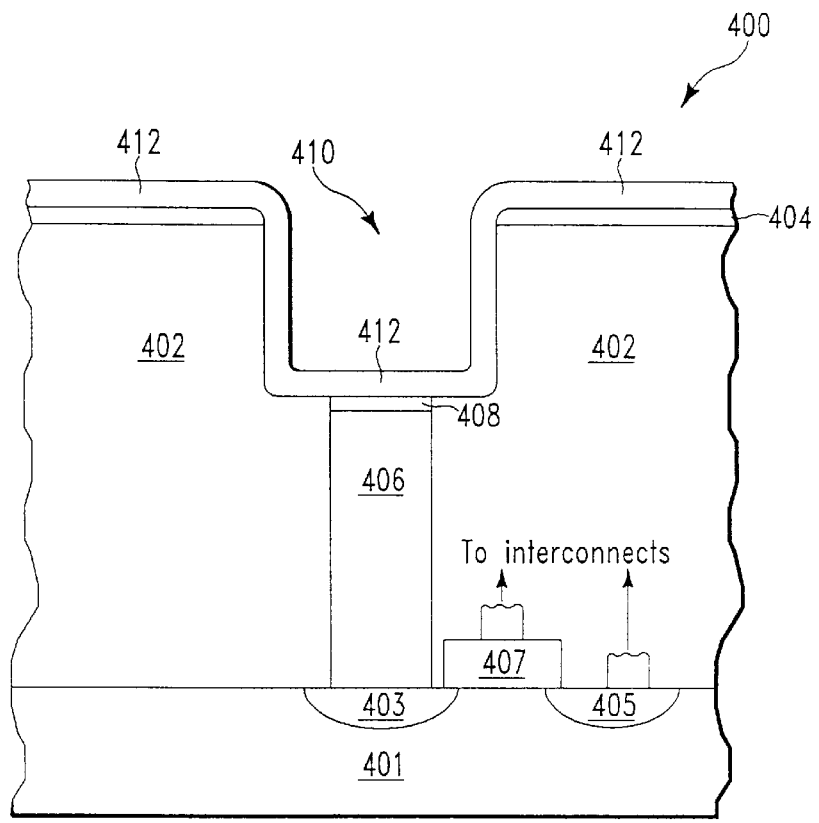

According to the first step of applicants' exemplary method, a conformal layer 412 of a conductive material is deposited over etch stop layer 404 and the sidewalls and bottom of cup 410, as shown in FIG. 4B. The conductive material 412 can be deposited using conventional physical vapor deposition (PVD) or chemical vapor deposition (CVD) techniques and deposition apparatus known in the art, such as the ENDURA™ Deposition System (PVD) or the GigaCap™ Deposition System (CVD), both available from Applied Materials, Inc., Santa Clara, Calif.

The conductive material is typically selected from the group consisting of platinum, iridium, and ruthenium, as these are high-temperature performance materials. If the conductive material is platinum, the conductive material layer 412 is typically a layer of a single material. However, if the conductive material is iridium or ruthenium, the conductive material layer 412 is a dual layer which includes a layer of the corresponding metal oxide (i.e., iridium oxide and ruthenium oxide, respectively) formed over the conductive material. The metal oxide is formed using oxidation techniques known in the art. The purpose of the metal oxide is to serve as an additional diffusion barrier.

Figure 4C:
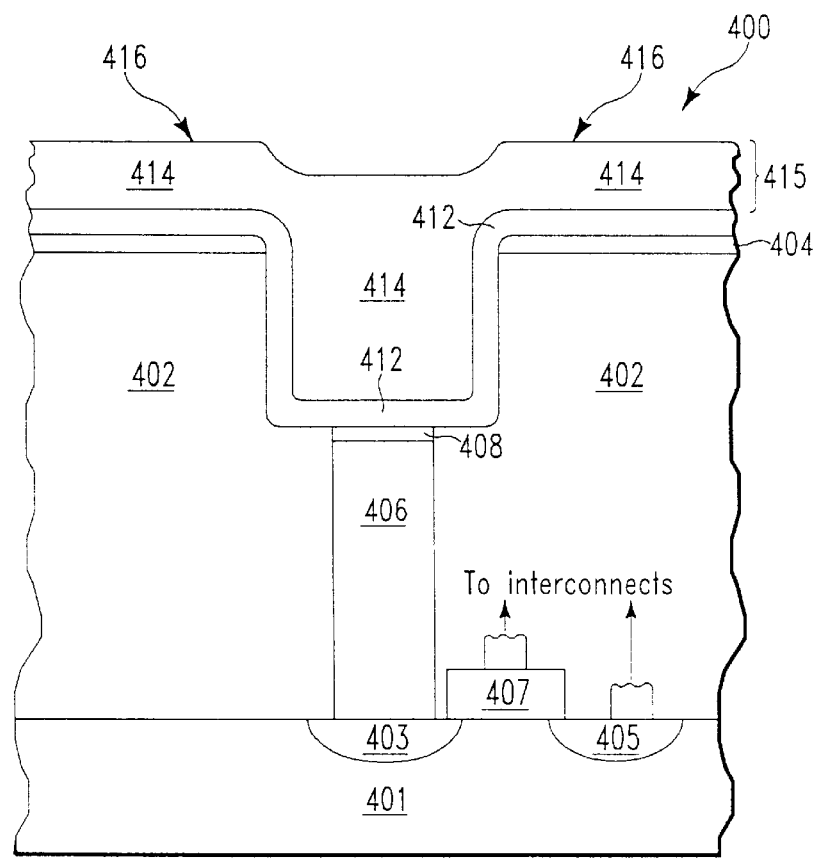

Referring to FIG. 4C, a layer 414 of sacrificial material is deposited to fill the cup 410. Preferably, the sacrificial layer 414 comprises a material which is capable of withstanding the high temperatures used during subsequent etching of the conductive material layer 412. The sacrificial layer 414 preferably comprises a material which is capable of withstanding temperatures of at least 150° C., and preferably up to about 450° C.

Another important requirement for the sacrificial material is that it must be relatively easily removed from the cup 410 after etch back of the conductive material layer 412. The sacrificial material 414 may be, for example, a high-temperature organic material. Any organic polymer that can be spun on to the wafer or deposited using CVD techniques is an ideal candidate. Many of the high-temperature, low dielectric constant (k<3.0) materials are ideal for this purpose, because they can be easily etched and are commonly used in semiconductor devices, and therefore readily available. The high-temperature organic material may be, for example, amorphous carbon-comprising materials referred to as "α-FC" materials; "α-FC" materials which are high-temperature fluorocarbons; bis-benzocyclobutene (BCB); SILK™ (available from Dow Chemical Co., Midland, Mich.); FLARE™ (available from Allied Signal, Sunnyvale, Calif.); poly(arylene) ethers; poly(arylene) ether oxazoles; Parylene-N; polyimides; polynaphthalene-N; polyphenyl-quinoxalines; polybenzoxazoles; polyphenylene-oxide; polyindane; polynorborene; and divinylsiloxane, by way of example, and not by way of limitation.

A unique feature of the present method is the ability to use a wide varity of sacrificial materials, such as the organic materials described above. Many of these organic materials (such as FLARE™) are too soft to be removed from a field surface using CMP techniques. Therefore, the present method allows the use of a wider range of sacrificial materials compared to prior art methods.

Alternatively, the sacrificial layer 414 may comprise an inorganic material, such as silicon oxide, spin-on glass (SOG), silicon carbide, silicon oxynitride, silicon nitride, carbon-containing silicon oxide (BLOK™), borosilicate glass (BSG), phosphosilicate glass (PSG), or borophosphosilicate glass (BPSG), by way of example, and not by way of is limitation. However, an inorganic material is more difficult to remove relative to underlying conductive material 412, i.e., the selectivity for etching an organic sacrificial material relative to a high-temperature metal is generally better than the selectivity for etching an inorganic sacrificial material relative to a high-temperature metal.

A sacrificial material having different etch properties than the conductive material is selected (i.e., the sacrificial material is not readily etched using the etchant gas compositions used to etch the conductive material), so that the sacrificial layer 414 can be etched without disturbing the underlying conductive layer 412 during subsequent steps of applicants' method. For example, if the conductive layer 412 is platinum, suitable sacrificial materials include FLARE™, SILK™, polyimide, and SOG, by way of example, and not by way of limitation.

If the semiconductor structure 400 shown in FIG. 4C includes optional etch stop layer 404, the sacrificial material should also be chosen so that it may be selectively etched relative to the etch stop layer 404 Use of an etch stop layer 404 is preferred, as it can be used to prevent etching into the dielectric layer 402 during removal of the residual sacrificial layer 414 in a subsequent processing step.

The deposition technique for the sacrificial material layer 414 will depend on the particular material used, but in most cases, the sacrificial material 414 can be deposited using conventional CVD or spin-on processes known in the art. The sacrificial material layer 414 is typically deposited in an amount sufficient to fill the cup 410. This produces a typical field surface 416 thickness 415 ranging from about one-half to about three times the width of cup 410.

With reference to FIG. 4C, because of the presence of the cups 410 in the dielectric layer 402, deposition of the sacrificial material tends to be non-uniform across the field surface 416 of the structure. The thickness of the sacrificial material may be up to 50% greater in non-patterned areas, such as field surface 416, than in patterned areas, such as cup 410. ("Non-patterned areas" refers to areas of the substrate wafer where there is a flat, planar field surface; "patterned areas" refers to areas of the substrate wafer into which cups, or other features, have been formed.)

Figure 4D:
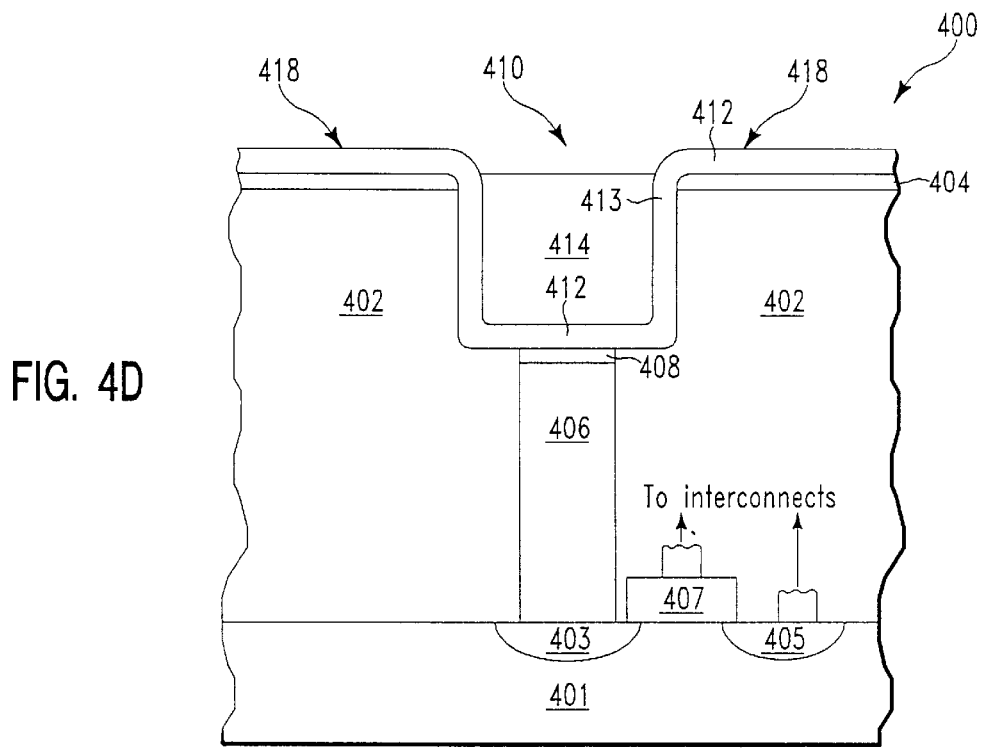

The sacrificial layer 414 is then plasma etched to remove sacrificial material from the field surface 416, as shown in FIG. 4D. Etching is performed using a plasma source gas composition which selectively etches the sacrificial material 414 relative to the conductive material 412.

During etching of the sacrificial material layer 414, the goal is to remove the portion of the sacrificial material 414 on the field surface 416, while minimizing removal of the sacrificial material 414 inside the cup 410. Because of the sacrificial material deposition non-uniformity described above, sacrificial material etching must be slowed down in patterned areas, where the thickness 415 of the sacrificial material 414 on the field surface 416 tends to be thinner. If etching occurs at the same rate in patterned and non-patterned areas, by the time that the portion of sacrificial material 414 on the field surface 416 has been removed in the non-patterned areas (where the sacrificial material layer tends to be thicker), there has been an unacceptable loss of sacrificial material 414 from inside the cup 410 in the patterned areas. The etch chemistry and process conditions are preferably be adjusted so that the sacrificial material etch rate is slower in the patterned areas than in the non-patterned areas, so that removal of sacrificial material 414 will proceed evenly across the field surface 416.

Plasma source gas compositions and process conditions for plasma etching two representative sacrificial materials, FLARE™ (an organic polymer) and SOG (spin-on glass), are provided in Table One, below. The source gas compositions and process conditions listed in Table One provide good results.

TABLE ONE

Typical Process Conditions for Plasma Etching of FLARE ™ and SOG

| Process Condition | FLARE ™* | SOG* |
|---|---|---|
| Ar (sccm) | 90–110 | 70–90 |
| $O_2$ (sccm) | 15–25 | — |
| $Cl_2$ (sccm) | 8–12 | — |

TABLE ONE-continued

Typical Process Conditions for Plasma Etching of FLARE ™ and SOG

| Process Condition | FLARE ™* | SOG** |
|---|---|---|
| CF$_4$ (sccm) | — | 15–25 |
| CHF$_3$ (sccm) | — | 70–90 |
| Plasma Source Power (W) | 800–1200 | 1400–1600 |
| Substrate Bias Power (W) | 40–60 | 90–110 |
| Process Chamber Pressure (mTorr) | 6–10 | 6–10 |
| Substrate Temperature (° C.) | 330–370 | 60–80 |

*FLARE, a poly(arylene ether), (available from Allied Signal Advanced Microelectronic Materials, Sunnyvale, CA) is an organic sacrificial material.
**Spin-on-glass (SOG) is an inorganic sacrificial material.

Figure 4E:
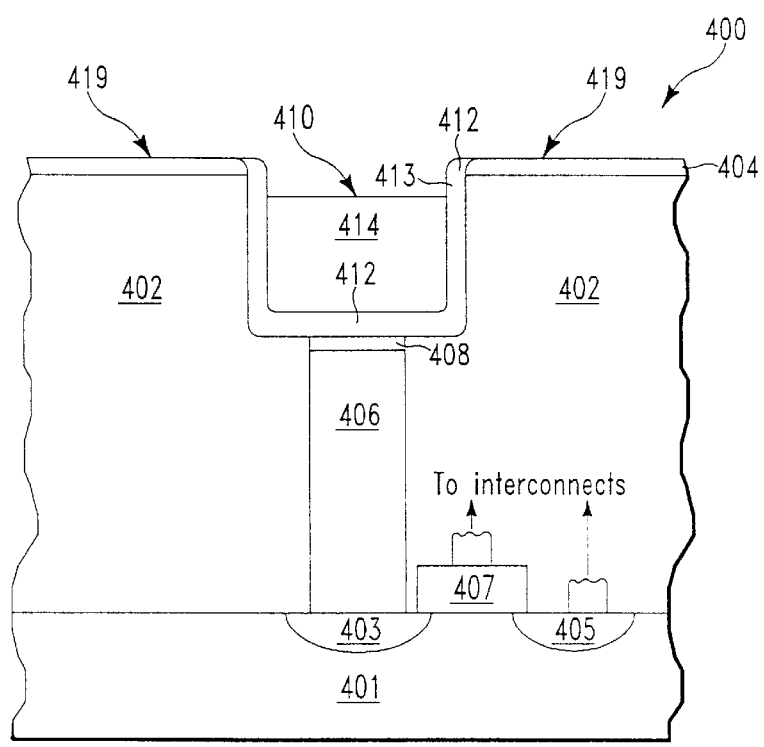

Following removal of the portion of the sacrificial material 414 on the field surface 416 (shown in FIG. 4D), the portion of the conductive material 412 on the field surface 418 is removed by plasma etching, as shown in FIG. 4E. The goals of the conductive material etching step are to remove the portion of the conductive material 412 on the field surface 418 and to minimize the etching of vertical portions of the conductive material 412 lining the sidewalls of the cup 410. The purpose of the sacrificial material 414 remaining inside the cup 410 is to protect the portions of the conductive material 412 lining the sidewalls and bottom of the cup 410. The sacrificial material 414 serves as a physical barrier against etching of the conductive material sidewall layer. If too much sacrificial material is removed from the cup during removal of sacrificial material from field surface 416, the upper conductive material sidewalls 413 are left unprotected and become vulnerable to attack by etchant species during etching of the field surface 418 conductive material 412.

With reference to FIG. 4E, the sacrificial material 414 inside the cup 410 can be protected during the etch back process for removal of the conductive layer 412 from the field surface 418 by using a source gas which selectively etches the conductive material 412 relative to the sacrificial material 414. If the semiconductor structure 400 includes optional etch stop layer 404, the source gas used in the conductive layer etching step should be chosen so that it selectively etches the conductive material 412 relative to the etch stop layer 404 (as well as the sacrificial material 414).

Plasma source gas compositions and process conditions for plasma etching of the portion of the conductive material 416 on the field surface 418 are provided in Tables Two and Three, below, for platinum and ruthenium/ruthenium oxide. The source gas compositions and process conditions set forth in Tables Two and Three provide good results.

TABLE TWO

Typical Process Conditions for Plasma Etching of Platinum

| Process Parameter | Range of Process Conditions | More Preferred Process Conditions | Optimum Known Process Conditions |
|---|---|---|---|
| Cl$_2$ Flow Rate (sccm) | 20–120 | 20–80 | 30–36 |
| N$_2$ Flow Rate (sccm) | 0–30 | 5–20 | 10–12 |
| Ar Flow Rate (sccm) | 5–50 | 5–30 | 10–12 |
| Plasma Source Power (W) | 500–2000 | 700–1500 | 900–1100 |
| Substrate Bias Power (W) | 200–700 | 300–600 | 400–500 |
| Process Chamber Pressure (mTorr) | 2–30 | 3–15 | 3–5 |
| Substrate Temperature (° C.) | 300–450 | 320–400 | 340–360 |

TABLE THREE

Typical Process Conditions for Plasma Etching of Ruthenium/Ruthenium Oxide

| Process Parameter | Range of Process Conditions | More Preferred Process Conditions | Optimum Known Process Conditions |
|---|---|---|---|
| O$_2$ Flow Rate (sccm) | 40–400 | 120–320 | 220–260 |
| Cl$_2$ Flow Rate (sccm) | 10–100 | 30–80 | 50–70 |
| Plasma Source Power (W) | 500–3000 | 700–2000 | 1000–1400 |
| Substrate Bias Power (W) | 50–450 | 100–300 | 125–175 |
| Process Chamber Pressure (mTorr) | 5–50 | 10–40 | 20–25 |
| Substrate Temperature (° C.) | 10–400 | 25–250 | 45–80 |

With reference to FIG. 4E, after the removal of the portion of the conductive material 412 on the field surface 418, the residual sacrificial material 414 remaining inside the cup 410 is removed by plasma etching, to produce the structure shown in cross-sectional view in FIG. 4F-A, where the field surface 419 of etch stop layer 404 is exposed. It is important that all of the remaining sacrificial material 414 is removed from the cup, in order to provide a clean surface for the deposition of a conformal dielectric layer 420 (described below and shown in FIG. 4G) in a subsequent processing step.

FIG. 4F-B shows a schematic top view of a number of semiconductor structures 400. As shown in FIG. 4F-B, after removal of the sacrificial material from the cup 410, the conductive material 412 lining the inside of the cup 410 remains intact.

The remaining sacrificial material 414 is removed using a plasma source gas composition which is highly selective toward etching the sacrificial material 414 relative to the conductive material 412. If the semiconductor structure 400 includes optional etch stop layer 404, the source gas used in the sacrificial material removal step should be chosen so that it selectively etches the sacrificial material 414 relative to the etch stop layer 404 (as well as the conductive material 412). The etch stop layer 404 prevents etching into the dielectric layer 402 during removal of the residual sacrificial layer 414.

Plasma source gas compositions and process conditions for plasma etching of the remaining sacrificial material are provided in Table Four, below, for representative sacrificial materials FLARE™ and SOG. In certain situations, the plasma source gas composition and process conditions used to remove the remaining sacrificial material 414 within the cup 410 may be the same as the plasma source gas composition and process conditions which were previously used to remove the field surface thickness of the sacrificial material 414. The source gas compositions and process conditions listed in Table Four provide good results.

TABLE FOUR

Typical Process Conditions for Plasma Etching of Remaining Sacrificial Material

| Process Condition | FLARE ™ | SOG |
|---|---|---|
| O$_2$ (sccm) | 3000–4000 | — |
| N$_2$ (sccm) | 450–550 | — |
| CHF$_3$ (sccm) | — | 70–90 |
| Ar (sccm) | — | 70–90 |

TABLE FOUR-continued

Typical Process Conditions for Plasma Etching
of Remaining Sacrificial Material

| Process Condition | FLARE ™ | SOG |
|---|---|---|
| CF$_4$ (sccm) | — | 15–25 |
| Plasma Source Power (W) | 1200–1400 | 1400–1600 |
| Substrate Bias Power (W) | 0 | 90–110 |
| Process Chamber Pressure (mTorr) | 2000–2500 | 6–10 |
| Substrate Temperature (° C.) | 250–275 | 60–80 |

Figure 4G:
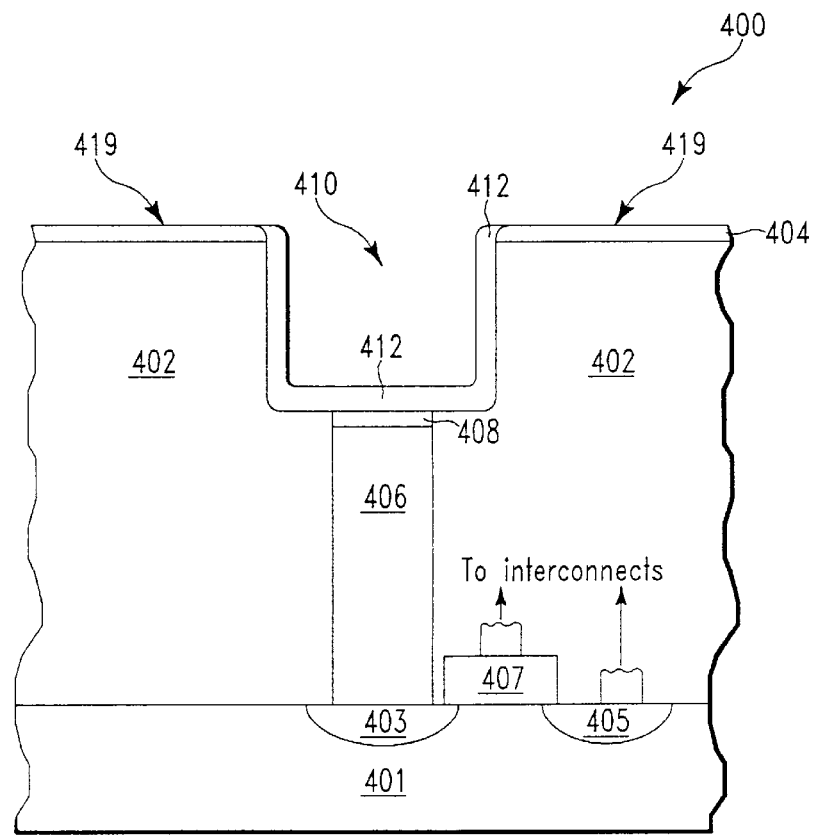
Figure 4G:
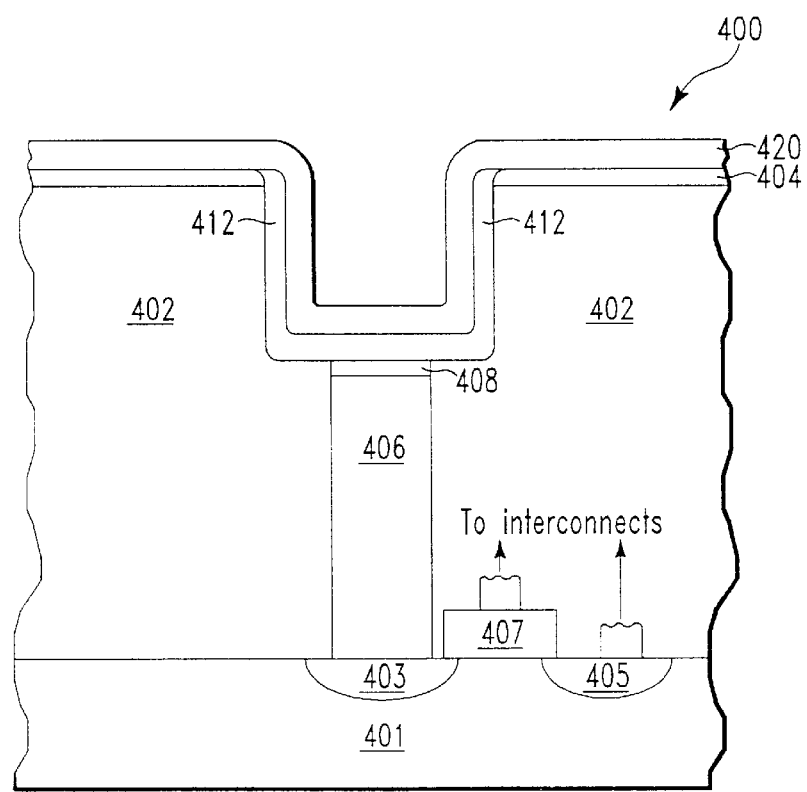

After the performance of applicants' method, subsequent processing steps can be performed, using techniques known in the art, to form a cup capacitor. Further processing steps typically include conformal deposition of a dielectric layer 420 (shown in FIG. 4G), followed by blanket deposition of a second conductive material layer 422 (shown in FIG. 4H), which serves as the top electrode. The dielectric layer 420 is typically a high dielectric constant (k>20) material, such as barium strontium titanate (BST), lead zirconium titanate (PZT), strontium bismuth tantalate (SBT), tantalum pentoxide (Ta$_2$O$_5$), by way of example and not by way of limitation. The second conductive material layer 422 is typically platinum, iridium/iridium oxide, or ruthenium/ruthenium oxide, by way of example and not by way of limitation. The second conductive material 422 may be the same as or different than the first conductive material 412. The dielectric layer 420 and second conductive material layer 422 are deposited using PVD or CVD deposition techniques known in the art. FIG. 4G shows the structure of the final cup capacitor 430.

Figure 4H:
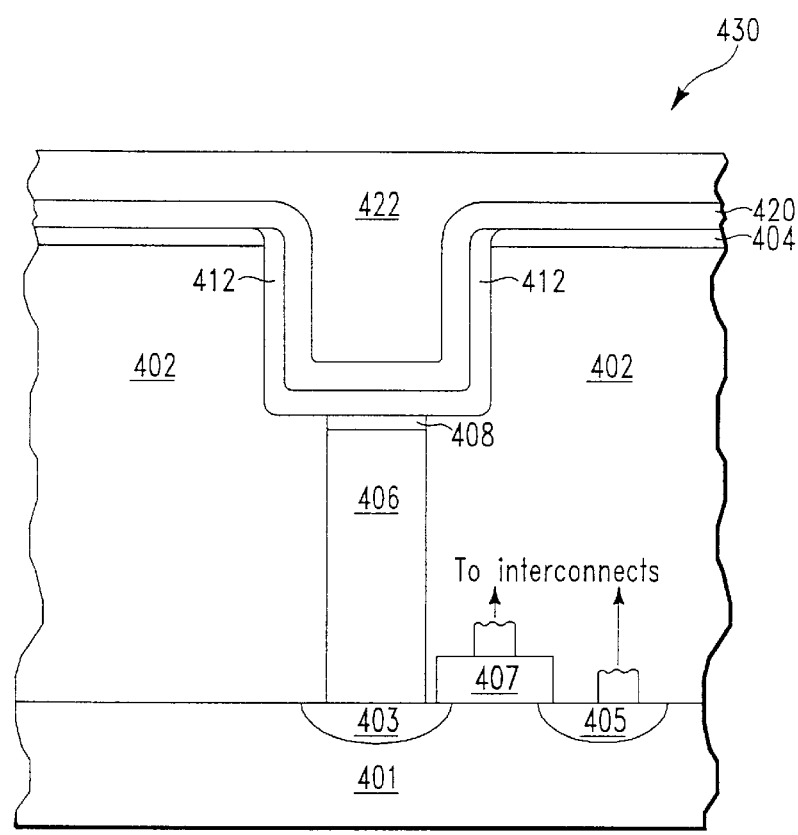

In certain situations, the field surface portion of the second conductive material layer 422 may be left in place (as shown in FIG. 4H), connecting a number of cup capacitors 430, so that these cup capacitors can be controlled together. In other areas of the substrate, the field surface portion of the second conductive material layer 422 between individual cup capacitors may be removed by pattern etching, to provide separate cup capacitors 430.

Figure 4I:
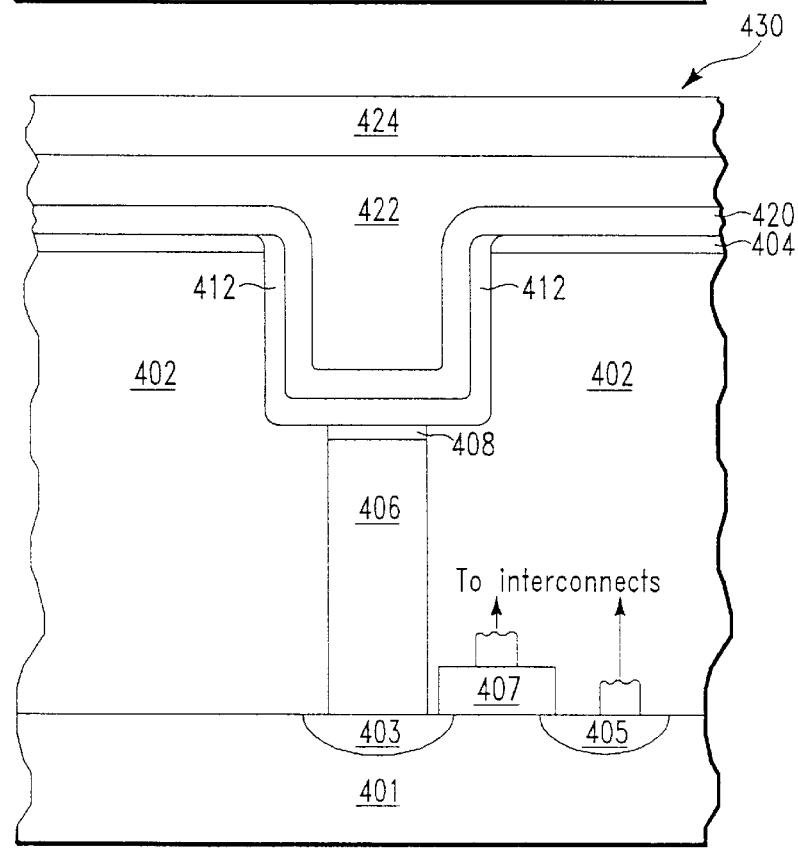
Figure 4J:
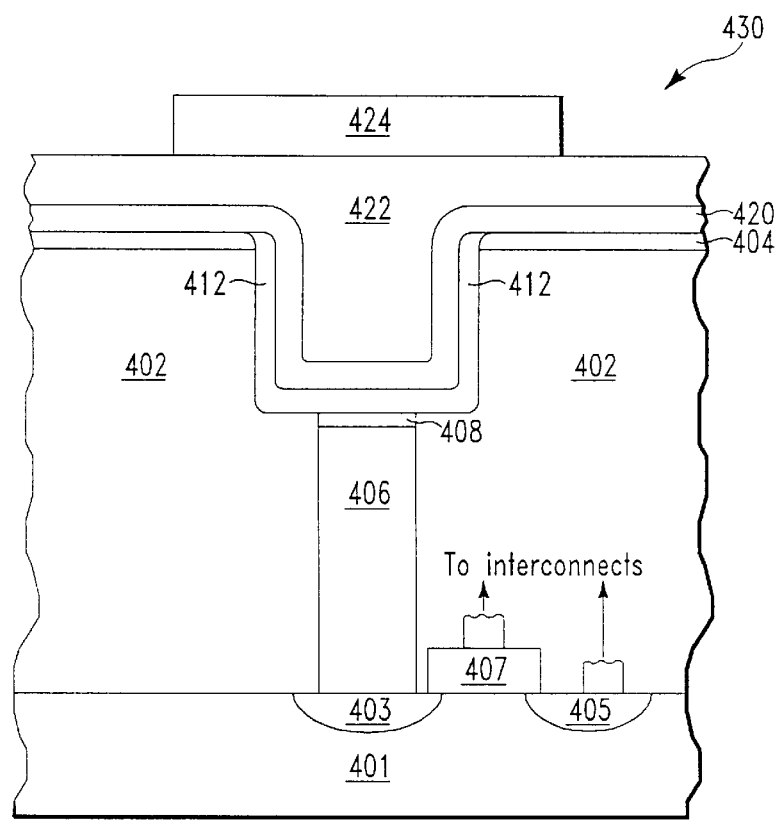
Figure 4K:
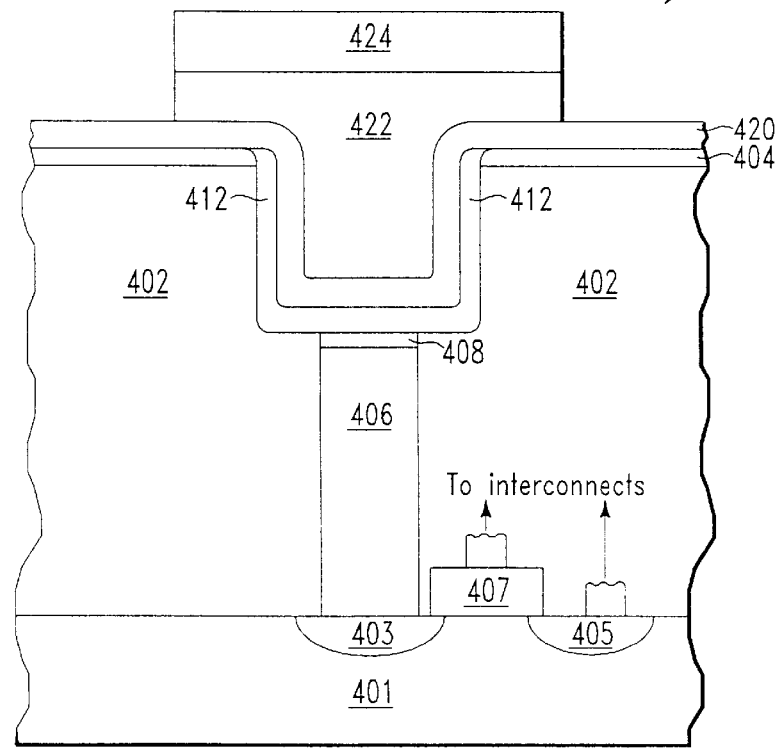

The second conductive material layer 422 can be pattern etched to form separate cup capacitors using techniques known in the art. This is typically done by first depositing a masking layer 424 (shown in FIG. 4I), which is typically a photoresist. Patterning of the masking layer 424 is then performed using techniques known in the art, depending on the particular masking material used. FIG. 4J shows the cup capacitor 430 after patterning of masking layer 424. Conductive material layer 422 is then pattern etched using techniques known in the art. If the second conductive material 422 is platinum or ruthenium/ruthenium oxide, the plasma etch chemistries presented in Tables Two and Three, respectively, can be used to pattern etch conductive material layer 422. FIG. 4K shows the cup capacitor 430 after pattern etching of conductive material layer 422. The residual masking layer 424 is then removed using techniques known in the art, depending on the particular masking material.

FIG. 4L-A shows a schematic cross-sectional view of the final cup capacitor structure 430 after removal of residual masking layer 424. Note that the top electrode 426, formed by conductive material layer 422, has a T-shaped structure.

FIG. 4L-B shows a schematic top view of a number of cup capacitors 430. Shown in FIG. 4L-B are both individual cup capacitors 430 (which have been separated by pattern etching of conductive material layer 422) and a grouping of conjoined cup capacitors 440 (which are connected together by conductive material layer 422).

EXAMPLES

Various experiments were performed during the development of applicants' method to optimize plasma source gas compositions and process conditions for the etching of various sacrificial materials and conductive materials. The experiments were conducted starting with the semiconductor structure 400 shown in FIG. 4C and described in general above, with the exception that the semiconductor structures used in the experiments did not include the polysilicon plug 406 and overlying diffusion barrier layer 408 shown in FIG. 4C. The results of these experiments are presented in the Examples below.

Example One

Referring to FIG. 4C, the semiconductor structure 400 used in the experiments described below included the following layers: a conformal layer 412 of platinum having a field surface thickness of about 300–600 Å; a silicon nitride etch stop layer 404 having a field surface thickness of about 1000–1500 Å; and a silicon oxide layer 402 having a thickness of about 4000–6000 Å, overlying a silicon substrate 401. The cups 410 were etched in the dielectric layer 402 to a depth of approximately 3000 Å. A layer 414 of FLARE™ was deposited over the semiconductor structure 400. As previously described, because of the presence of the cups in the substrate wafer, deposition of the sacrificial material tends to be non-uniform across the field surface of the substrate. In this experiment, FLARE layer 414 had a field surface thickness of about 6000 Å in non-patterned areas and about 4000 Å in patterned areas of the substrate.

Experiments were performed to examine the effects of varying the plasma source gas compositions and process conditions during etching of the FLARE and platinum layers. The source gas compositions and process conditions used during these experiments are presented in Tables Five, Six, and Seven, below. The results of each experiment are described below the table containing the process conditions for that experiment.

TABLE FIVE

FLARE and Platinum Etch - Example Process Conditions,
One Step Etch Process

| | Run# | | |
|---|---|---|---|
| Process Condition | 1 FLARE/Pt Etch | 2 FLARE/Pt Etch | 3 FLARE/Pt Etch |
| Ar (sccm) | 10 | 10 | 10 |
| Cl$_2$ (sccm) | 30 | 30 | 30 |
| N$_2$ (sccm) | 10 | 10 | 10 |
| Source Power (W) | 1000 | 1000 | 1000 |
| Bias Power (W) | 500 | 500 | 500 |
| Chamber Pressure (mTorr) | 3 | 3 | 3 |
| Helium Pressure (T) | 4 | 4 | 4 |
| Cathode Temp. (° C.) | 350 | 350 | 350 |
| Etch Time (sec) | 235 | 225 | 160 |

During Runs #1–3, above, the FLARE and platinum field surface portions were etched in a single etch step, utilizing the same source gas composition and process conditions for etching both materials. Runs #1–3 all utilized the same source gas composition and process conditions for FLARE/platinum etching. Only the total etch time was varied in Runs #1–3.

Etch results from Runs #1–3 were unfavorable. In Run #1, which had the longest etch time (235 sec), there was too much overetch, which resulted in a complete loss of the silicon nitride etch stop layer. In Run #2, which had a slightly shorter etch time (225 sec), the field surface was completely cleared of FLARE and platinum in non-patterned areas; however, there again was a complete loss of the silicon nitride etch stop layer. In Run #3, which utilized the shortest etch time (160 sec), the field surface was cleared of FLARE and platinum in patterned areas, but approximately 1500 Å of FLARE remained in the non-patterned areas.

Based on the results of Runs #1–3, we came to the conclusion that separate etch processes were needed for etching the FLARE and platinum field surface portions. Tables Six and Seven, below, provide source gas compositions and process conditions used during experiments in which the FLARE and platinum field surface portions were etched in separate etch steps, using different source gas compositions and process conditions.

TABLE SIX

FLARE and Platinum Etch - Example Process Conditions, Two Step Etch Process

| | Run # | | | | | |
|---|---|---|---|---|---|---|
| | 4 | | 5 | | 6 | |
| Process Condition | FLARE | Pt | FLARE | Pt | FLARE | Pt |
| Ar (sccm) | 90 | 10 | 90 | 10 | 100 | 10 |
| $O_2$ (sccm) | 30 | — | 30 | — | 20 | — |
| $Cl_2$ (sccm) | — | 30 | — | 30 | — | 30 |
| $N_2$ (sccm) | — | 10 | — | 10 | — | 10 |
| Source Power (W) | 1000 | 1000 | 1000 | 1000 | 1000 | 1000 |
| Bias Power (W) | 50 | 500 | 50 | 500 | 50 | 500 |
| Chamber Pressure (mTorr) | 8 | 3 | 8 | 3 | 16 | 3 |
| Helium Pressure (T) | 4 | 4 | 4 | 4 | 4 | 4 |
| Cathode Temp. (° C.) | 350 | 350 | 350 | 350 | 350 | 350 |
| Etch Time (sec) | 68 | 16 | 69 | 25 | 84 | 22 |

After the FLARE etch step of Run #4, the FLARE had been completely removed from the field surface in non-patterned areas and etching was stopped at the top surface of the platinum layer. However, there was a loss of about 1600–2000 Å of FLARE from inside the cups. After the platinum etch step of Run #4, the platinum had not been completely cleared from the field surface; therefore, it was determined that the 16-second platinum etch time was not long enough.

Run #5 utilized the same source gas composition and process conditions as Run #4, for both FLARE and platinum etch, with a platinum etch time that was approximately 50% longer than in Run #4 (25 sec vs. 16 sec). After the FLARE etch step of Run #5, the FLARE had been completely removed from the field surface in non-patterned areas, and etching was stopped at the top surface of the platinum layer. After the platinum etch step of Run #5, the platinum-lined cups were intact at the center of the wafer, but the platinum at the bottom of the cups had been etched through at the edges of the wafer.

Run #6 utilized slightly different source gas flow rates, a higher process chamber pressure (16 mTorr), and a longer etch time (84 sec) during the FLARE etch step than Runs #4 and 5. The $O_2$ content of the plasma source gas was decreased by 33% (from 30 sccm to 20 sccm). Total gas flow remained the same, with the remainder of the source gas being argon (increased from 90 sccm to 100 sccm). After the FLARE etch step of Run #6, there was a loss of about 1900–2200 Å of FLARE from inside the cups, which was a higher FLARE loss than observed in Runs #4 and 5.

Platinum etch process conditions for Run #6 were the same as those used in Runs #4 and 5, with an intermediate (22 sec) platinum etch time. The platinum lining the cups was intact in most areas of the wafer; however, the platinum at the bottom of the cups was etched through at the top edge of the wafer (represented by reference numeral 150 in FIG. 1B).

TABLE SEVEN

FLARE and Platinum Etch - Example Process Conditions, Two Step Etch Process

| | Run # | | | | |
|---|---|---|---|---|---|
| | 7 | | 8 | | |
| Process Condition | FLARE | Pt | FLARE | Pt | FLARE (strip) |
| Ar (sccm) | 100 | 10 | 100 | 10 | — |
| $O_2$ (sccm) | 15 | — | 20 | — | 3500 |
| $Cl_2$ (sccm) | — | 30 | 10 | 30 | — |
| $N_2$ (sccm) | — | 10 | — | 10 | 500 |
| Source Power (W) | 1000 | 1000 | 1000 | 1000 | 1400 |
| Bias Power (W) | 50 | 500 | 50 | 500 | 0 |
| Chamber Pressure (mTorr) | 6 | 3 | 8 | 3 | 2000 |
| Helium Pressure (T) | 4 | 4 | 4 | 4 | 4 |
| Cathode Temp. (° C.) | 350 | 350 | 350 | 350 | 250 |
| Etch Time (sec) | 121 | 22 | 100 | 22 | 100 |

The FLARE etch step of Run #7 utilized even less $O_2$ (15 sccm) than Run #6 (20 sccm $O_2$). The process chamber pressure was decreased to 6 mTorr. FLARE etch time was increased to 121 seconds. After the FLARE etch step of Run #7, there was a loss of about 1600–2000 Å of FLARE from inside the cups, which was similar to Run #4. However, the FLARE etch rate was significantly reduced.

Platinum etch process conditions for Run #7 were the same as those used in Runs #4–6, with a 22-second platinum etch time (same as Run #6). After the platinum etch step of Run #7, the platinum had been completely cleared from the field surface at the edges of the wafer, but there was still about a 50 Å thick field surface portion of platinum left in non-patterned areas at the center of the wafer.

The FLARE etch step of Run #8 utilized the same source gas composition as Run #6, with the addition of 10 sccm of $Cl_2$, to dilute the effects of the $O_2$. A process chamber pressure of 8 mTorr (same as Runs #4 and 5) was utilized. The FLARE etch time was increased to 100 seconds.

The platinum etch step of Run #8 utilized the same process conditions as Runs #4–7. Platinum etch time was held at 22 seconds (same as Runs #6 and 7). After the platinum etch step of Run #7, approximately 800 Å of FLARE remained inside the cups. Silicon nitride loss was less than 300 Å. The platinum was completely removed from the field surface in all areas of the wafer, with no residues remaining in non-patterned areas.

Run #8 provided the best overall results of the eight experimental runs. A final, stripping step was performed after the platinum etch step of Run #8 to remove the remaining FLARE from inside the cup. Referring to FIG. 1A, the wafer was moved to an advanced strip-and-passivation (ASP) chamber 104 for stripping of the FLARE from the cups. The FLARE stripping step utilized a plasma source gas of 3500 sccm $O_2$ and 500 sccm $N_2$, a plasma source power of 1400 W, no substrate bias power, a process chamber pressure of 2000 mTorr (2 Torr), a substrate temperature of 250° C., and an etch time of 100 seconds. After complete stripping of the FLARE from inside the cups, the platinum-lined cups remained intact across the entire wafer.

Example Two

Referring to FIG. 4C, the semiconductor structure 400 used in the experiments described below included the following layers: a conformal layer 412 of platinum having a field surface thickness of about 300–600 Å; a silicon nitride etch stop layer 404 having a field surface thickness of about 700–1200 Å; and a silicon oxide layer 402 having a thickness of about 4000–6000 Å, overlying a silicon substrate 401. The cups 410 were etched in the dielectric layer 402 to a depth of approximately 3000 Å. A layer 414 of SOG was deposited over the semiconductor structure 400. In this experiment, SOG layer 414 had a field surface thickness of about 6000 Å in non-patterned areas and about 4500 Å in patterned areas of the substrate.

Experiments were performed to examine the effects of using various plasma source gas compositions and process conditions during etching of the SOG and platinum layers. The source gas compositions and process conditions used during these experiments are presented in Table Eight, below.

TABLE EIGHT

SOG and Platinum Etch - Example Process Conditions

| | Run # | | | | | |
|---|---|---|---|---|---|---|
| | 9 | | 10 | | 11 | |
| Process Condition | SOG | Pt | SOG | Pt | SOG | Pt |
| Ar (sccm) | 80 | 10 | 80 | 10 | 80 | 10 |
| $CF_4$ (sccm) | 20 | — | 20 | — | 20 | — |
| $CHF_3$ (sccm) | 80 | — | 80 | — | 80 | — |
| $Cl_2$ (sccm) | — | 30 | — | 30 | — | 30 |
| $N_2$ (sccm) | — | 10 | — | 10 | — | 10 |
| Source Power (W) | 1500 | 1000 | 1500 | 1000 | 1500 | 1000 |
| Bias Power (W) | 100 | 500 | 100 | 500 | 100 | 500 |
| Chuck Voltage (V) | 1800 | 1000 | 1800 | 1000 | 1800 | 1000 |
| Chamber Pressure (mTorr) | 7 | 3 | 7 | 3 | 7 | 3 |
| Helium Pressure (T) | 7 | 3 | 7 | 3 | 7 | 3 |
| Cathode Temp. (° C.) | 70 | 340 | 70 | 340 | 70 | 340 |
| Etch Time (sec) | 200 | 24 | 150 | 24 | 170 | 24 |

Runs #9–11 all utilized the same source gas composition and process conditions for SOG/platinum etching. Only the etch time of the SOG etch step was varied in Runs #9–11.

Run #9 utilized an SOG etch time of 200 seconds. After the SOG etch step of Run #9, there was too much overetch, which resulted in less than 500 Å of SOG being left in the cups. After the platinum etch step of Run #9, the platinum lining the bottom of the cups was not intact, due to the removal of too much SOG from the cups during the SOG etch step.

For Run #10, the SOG etch time was decreased to 150 seconds. After the SOG etch step of Run #10, there was still about a 500 Å thick field surface portion of SOG remaining in patterned areas. Clearly, this etch time was too short, just as the SOG etch time in Run #9 was too long. After the platinum etch step of Run #10, there was still platinum remaining on the field surface.

For Run #11, the SOG etch time was increased to 170 seconds (intermediate between the SOG etch times of Runs #9 and 10). After the SOG etch step of Run #11, the SOG had been completely cleared from the field surface in patterned areas. About 800 Å of SOG had been lost from the inside of the cup. After the platinum etch step of Run #11, approximately 1000 Å of SOG remained inside the cups. Approximately 200 Å of silicon nitride was removed. The platinum was completely removed from the field surface in all areas of the wafer, with no residues remaining in non-patterned areas.

After etching of the platinum, the remaining SOG inside the cup can be removed by plasma etching using the SOG etch chemistry and process conditions previously described. In a less preferred embodiment, the remaining SOG can be removed by immersing the substrate wafer in a 6:1 HF solution for approximately 60 seconds.

In order to increase the anisotropicity of platinum etching, the platinum etch steps described in Examples One (Runs #1–8) and Two (Runs #9–11), above, utilized a very high substrate bias power of 500 W. As previously described, a high bias power provides a driving force to direct etchant species toward the substrate surface, which minimizes lateral etching inside the cup, and protects the vertical platinum sidewall portions and the sacrificial material (e.g., FLARE or SOG) inside the cup.

Based on the results of Runs #1–8 (presented above), Table Nine, below, includes typical process conditions for performing applicants' method, using platinum as the conductive material and FLARE as the sacrificial material.

TABLE NINE

Typical Process Conditions for Forming a Cup Capacitor

| Process Condition | FLARE Etch | Pt Etch | FLARE Strip |
|---|---|---|---|
| Ar (sccm) | 90–110 | 10–12 | — |
| $O_2$ (sccm) | 15–25 | — | 3000–4000 |
| $Cl_2$ (sccm) | 8–12 | 30–36 | — |
| $N_2$ (sccm) | — | 10–12 | 450–550 |
| Source Power (W) | 800–1200 | 900–1100 | 1200–1400 |
| Bias Power (W) | 40–60 | 400–500 | 0 |
| Chamber Pressure (mTorr) | 6–10 | 3–5 | 2000–2500 |
| SubstrateTemp. (° C.) | 330–370 | 340–360 | 250–275 |
| Etch Time (sec) | 90–110 | 20–25 | 90–120 |

Based on the results of Runs #9–11 (presented above), Table Ten, below, includes typical process conditions for performing applicants' method, using platinum as the conductive material and SOG as the sacrificial material.

TABLE TEN

Typical Process Conditions for Forming a Cup Capacitor

| Process Condition | SOG Etch | Pt Etch | SOG Strip |
|---|---|---|---|
| Ar (sccm) | 70–90 | 10–12 | 70–90 |
| $O_2$ (sccm) | — | — | — |
| $Cl_2$ (sccm) | — | 30–36 | — |
| $N_2$ (sccm) | — | 10-12 | — |
| $CHF_3$ (sccm) | 70–90 | — | 70–90 |
| $CF_4$ (sccm) | 15–25 | — | 15–25 |
| Source Power (W) | 1400–1600 | 900–1100 | 1400–1600 |
| Bias Power (W) | 90–110 | 400–500 | 90–110 |
| Chamber Pressure (mTorr) | 6–10 | 3–5 | 6–10 |
| Substrate Temp. (° C.) | 60–80 | 340–360 | 60–80 |
| Etch Time (sec) | 150–200 | 20–30 | 80–100 |

Example Three

Referring to FIG. 4C, the semiconductor structure 400 used in the experiments described below included the following layers: a conformal layer 412 of ruthenium/ruthenium oxide having a field surface thickness of about 200–500 Å; a tantalum oxide etch stop layer 404 having a field surface thickness of about 50–75 Å; and a TEOS layer 402 having a thickness of about 12,000–18,000 Å, overlying a silicon substrate 401. The cups 410 were etched in the dielectric layer 402 to a depth of approximately 10,000 Å. A layer 414 of $FO_x$® (Flowable Oxide (available from Dow Corning, Midland, Mich.) was deposited over the semiconductor structure 400. In this experiment, $FO_x$ layer 414 had a field surface thickness of about 4000 Å in non-patterned areas and about 2000 Å in patterned areas of the substrate.

Experiments were performed to examine the effects of using various plasma source gas compositions and process conditions during etching of the $FO_x$ and ruthenium/ruthenium oxide layers. The source gas compositions and process conditions used during these experiments are presented in Table Eleven, below.

TABLE ELEVEN $FO_X$ and Ruthenium/Ruthenium Oxide Etch - Example Process Conditions

| Process Condition | $FO_X$ Etch | Ru/RuO$_X$ Etch |
|---|---|---|
| Ar (sccm) | 80 | — |
| O$_2$ (sccm) | — | 240 |
| Cl$_2$ (sccm) | — | 60 |
| N$_2$ (sccm) | — | — |
| CHF$_3$ (sccm) | 35 | — |
| CF$_4$ (sccm) | 20 | — |
| Source Power (W) | 1500 | 1200 |
| Bias Power (W) | 100 | 150 |
| Chamber Pressure (mTorr) | 7 | 22 |
| Substrate Temp. (° C.) | 45 | 45 |
| Etch Time (sec) | 125 | 75 |

After etching of the ruthenium/ruthenium oxide, the remaining $FO_x$ inside the cup was removed by immersing the substrate wafer in a 6:1 HF solution for approximately 120 seconds. Alternatively, the remaining $FO_x$ can be removed by plasma etching using the $FO_x$ etch chemistry and process conditions set forth in Table Eleven, above.

After removal of the remaining $FO_x$ inside the cup 410, the tantalum oxide etch stop layer 404 was removed by plasma etching using the following process conditions: 100 sccm Cl$_2$, 20 sccm N$_2$, 20 sccm Ar, 1200 W source power, 120 W substrate bias power, and 10 mTorr process chamber pressure. Etching was performed for 45 seconds.

Based on the results of the above experiment, Table Twelve, below, includes typical process conditions for performing applicants' method, using ruthenium/ruthenium oxide as the conductive material and $FO_x$ as the sacrificial material.

TABLE TWELVE

Typical Process Conditions for Forming a Cup Capacitor

| Process Condition | $FO_X$ Etch | Ru/RuO$_X$ Etch | $FO_X$ Strip |
|---|---|---|---|
| Ar (sccm) | 70–90 | — | 70–90 |
| O$_2$ (sccm) | — | 200–280 | — |
| Cl$_2$ (sccm) | — | 50–70 | — |
| N$_2$ (sccm) | — | — | — |
| CHF$_3$ (sccm) | 30–40 | — | 30–40 |
| CF$_4$ (sccm) | 18–22 | — | 18–22 |
| Source Power (W) | 1300–1700 | 1000–1400 | 1300–1700 |
| Bias Power (W) | 75–125 | 100–200 | 75–125 |
| Chamber Pressure (mTorr) | 5–10 | 18–30 | 5–10 |
| Substrate Temp. (° C.) | 25–80 | 25–80 | 25–80 |
| Etch Time (sec) | 100–150 | 50–100 | 100–150 |

The above described preferred embodiments are not intended to limit the scope of the present invention, as one skilled in the art can, in view of the present disclosure expand such embodiments to correspond with the subject matter of the invention claimed below.

We claim:

1. A method of forming a cup capacitor, comprising the following steps:
   a) providing a semiconductor structure including a dielectric layer overlying a semiconductor substrate, wherein a cup is present in said dielectric layer, the cup having an opening at an upper surface of said dielectric layer;
   b) depositing a conformal layer of a conductive material selected from the group consisting of platinum, iridium/iridium oxide, ruthenium/ruthenium oxide, and combinations thereof over said dielectric layer, including the sidewalls and bottom of said cup;
   c) depositing a layer of a sacrificial material over said conductive material, in an amount sufficient to fill said cup;
   d) removing sacrificial material present on an upper surface of said conductive layer outside of and adjacent to said cup by plasma etching, using a plasma source gas which selectively etches said sacrificial material relative to said conductive material;
   e) removing conductive material present on an upper surface of said dielectric layer outside of and adjacent to said cup by plasma etching, using a plasma source gas which selectively etches said conductive material relative to said sacrificial material remaining inside of said cup; and
   f) removing sacrificial material remaining inside of said cup by etching, using an etchant which selectively etches said sacrificial material inside of said cup relative to said conductive material inside of said cup, whereby said conductive material inside of said cup has an exposed upper surface which is flat and smooth.

2. The method of claim 1, wherein said sacrificial material is capable of withstanding temperatures of at least 150° C. up to about 450° C.

3. The method of claim 1, wherein said sacrificial material is a high-temperature organic material.

4. The method of claim 1, wherein said high-temperature organic material is selected from the group consisting of: an amorphous carbon-comprising material, BCB, SILK™, FLARE™, poly(arylene) ethers, poly(arylene) ether oxazoles, Parylene-N, polyimides, polynaphthalene-N, polyphenyl-quinoxalines, polybenzoxazoles, polyphenylene-oxide, polyindane, polynorborene, divinylsiloxane, and combinations thereof.

5. The method of claim 1, wherein said conductive material is platinum.

6. The method of claim 5, wherein said sacrificial material is FLARE, and said FLARE is plasma etched in step d) using a plasma source gas comprising argon and oxygen.

7. The method of claim 6, herein said plasma source gas used in step d) further comprises chlorine.

8. The method of claim 5, wherein said platinum is plasma etched using a plasma source gas comprising argon, a chlorine-comprising gas, and a nitrogen-comprising gas.

9. The method of claim 8, wherein said platinum is plasma etched using a plasma source gas comprising argon, Cl$_2$, and N$_2$.

10. The method of claim 5, wherein said sacrificial material is FLARE, and said FLARE is plasma etched in step f) using a plasma source gas comprising oxygen and nitrogen.

11. The method of claim 1, wherein said conductive material is ruthenium/ruthenium oxide.

12. The method of claim 11, wherein said ruthenium/ruthenium oxide is plasma etched using a plasma source gas comprising an oxygen-comprising gas and a chlorine-comprising gas.

13. The method of claim 12, wherein said ruthenium/ruthenium oxide is plasma etched using a plasma source gas comprising $O_2$ and $Cl_2$.

14. The method of claim 1, wherein said semiconductor structure further includes a patterned etch stop layer overlying an upper surface of said dielectric layer and underlying an upper surface of said conductive material outside of said cup.

15. The method of claim 14, wherein said etch stop layer comprises a dielectric material.

16. The method of claim 15, wherein said dielectric material is selected from the group consisting of silicon nitride, silicon oxynitride, silicon carbide, or tantalum oxide.

17. The method of claim 14, wherein said conductive material is plasma etched using a plasma source gas which selectively etches said conductive material relative to said etch stop layer.

18. The method of claim 16, wherein said conductive material is platinum and said etch stop layer is silicon nitride.

19. The method of claim 18, wherein said platinum is plasma etched using a plasma source gas comprising argon, $Cl_2$, and $N_2$.

20. The method of claim 16, wherein said conductive material is ruthenium/ruthenium oxide and said etch stop layer is tantalum oxide.

21. The method of claim 20, wherein said ruthenium/ruthenium oxide is plasma etched using a plasma source gas comprising an oxygen-comprising gas and a chlorine-comprising gas.

22. The method of claim 14, wherein said sacrificial material is plasma etched in step f) using a plasma source gas which selectively etches said sacrificial material relative to said etch stop layer.

23. The method of claim 16, wherein said sacrificial material is FLARE and said etch stop layer is silicon nitride.

24. The method of claim 23, wherein said FLARE is plasma etched in step f) using a plasma source gas comprising oxygen and nitrogen.

25. The method of claim 1, wherein said dielectric layer comprises silicon oxide.

26. The method of claim 1, wherein said substrate comprises silicon.

27. The method of claim 1, wherein steps b), c), d), e), and f) are performed in a multi-chambered processing apparatus.

28. The method of claim 14, wherein said method further comprises the following step:

g) depositing a conformal layer of a dielectric material over said etch stop layer and said conductive material layer, including the sidewalls and bottom of said cup.

29. The method of claim 28, wherein said dielectric material deposited in step g) is a high dielectric constant material.

30. The method of claim 29, wherein said high dielectric constant material is selected from the group consisting of BST, PZT, SBT, and $Ta_2O_5$.

31. The method of claim 28, wherein said method further comprises the following step:

h) depositing a second layer of a conductive material over said conformal dielectric material layer, in an amount sufficient to fill said cup.

32. The method of claim 31, wherein said conductive material deposited in step h) is selected from the group consisting of platinum, iridium/iridium oxide, and ruthenium/ruthenium oxide.

33. The method of claim 31, wherein said method further comprises the following step:

i) depositing a masking layer over said second conductive material layer.

34. The method of claim 33, wherein said method further comprises the following step:

j) patterning said masking layer.

35. The method of claim 34, wherein said method further comprises the following step:

k) pattern etching said second conductive material layer.

36. The method of claim 1, wherein said conductive material comprises a metal.

37. The method of claim 5, wherein said sacrificial material is a high temperature organic material, and said high temperature organic material is plasma etched in step d) using a plasma source gas comprising argon and oxygen.

38. The method of claim 37, wherein said plasma source gas used in step d) further comprises chlorine.

* * * * *